(12) United States Patent
Yamanaka

(10) Patent No.: US 11,943,978 B2
(45) Date of Patent: Mar. 26, 2024

(54) DISPLAY DEVICE

(71) Applicant: SHARP KABUSHIKI KAISHA, Sakai (JP)

(72) Inventor: Shigetsugu Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 457 days.

(21) Appl. No.: 17/424,834

(22) PCT Filed: Feb. 6, 2019

(86) PCT No.: PCT/JP2019/004257
§ 371 (c)(1),
(2) Date: Jul. 21, 2021

(87) PCT Pub. No.: WO2020/161829
PCT Pub. Date: Aug. 13, 2020

(65) Prior Publication Data
US 2022/0140056 A1    May 5, 2022

(51) Int. Cl.
*H10K 59/131*    (2023.01)
*G06F 1/18*    (2006.01)

(52) U.S. Cl.
CPC .......... *H10K 59/131* (2023.02); *G06F 1/189* (2013.01)

(58) Field of Classification Search
CPC ...... H10K 59/131; H10K 59/88; G06F 1/189; H05K 1/189; H05K 2201/09418; H05K 2201/10128; H05K 1/118; G09F 9/30; H01L 29/786
See application file for complete search history.

(56) References Cited

FOREIGN PATENT DOCUMENTS

| CN | 109076699 | * 12/2018 |
| JP | 2009-088096 A | 4/2009 |

OTHER PUBLICATIONS

Shimizu et al. (CN 109076699) machine translation (Year: 2018).*

* cited by examiner

*Primary Examiner* — Yasser A Abdelaziez
(74) *Attorney, Agent, or Firm* — ScienBiziP, P.C.

(57) ABSTRACT

A display device includes first power supply terminal electrodes and second power supply terminal electrodes. The first power supply terminal electrodes in a first terminal portion of a frame area at least partially overlap, in a plan view, at least a part of the second power supply terminal electrodes in a second terminal portion of a flexible printed board. The second power supply terminal electrodes are electrically connected to the first power supply terminal electrodes. Either the first power supply terminal electrodes or the second power supply terminal electrodes are inclined from the others.

21 Claims, 17 Drawing Sheets

DISPLAY DEVICE

TECHNICAL FIELD

The disclosure relates to display devices.

BACKGROUND ART

The OLED display device, or the self-luminous display device built around OLEDs (organic light-emitting diodes), has been attracting attention as an alternative to the liquid crystal display device. In the OLED display device, electric power is supplied to a plurality of OLEDs in a display area via, for example, a flexible printed board (or flexible printed circuit, "FPC").

The flexible printed board is connected to a terminal portion of a frame area around the display area by pressure bonding using, for example, conductive paste. This particular bonding establishes electrical connections between the power supply terminal electrodes on the terminal portion and the power supply terminal electrodes on the flexible printed board via the conductive paste.

Precision can vary in pressure-bonding these power supply terminal electrodes, which may lead to non-uniform inter-electrode pressure bonding areas. To address this inconvenience, a structure has been proposed that reduces inter-electrode pressure bonding discrepancy in connecting the power supply terminal electrodes by pressure bonding.

As an example, Patent Literature 1 discloses a mounting structure including a substrate having a surface on which there is provided a conductor that is pressure-bonded to projecting electrodes of electronic components using a bonding member, to mount the electronic components to the substrate. The mounting structure further includes wall-shaped guide members disposed on the surface so as to flank the conductor.

CITATION LIST

Patent Literature

Patent Literature 1: Japanese Unexamined Patent Application Publication, Tokukai, No. 2009-88096

SUMMARY

Technical Problem

The mounting structure disclosed in Patent Literature 1 described above requires the guide members that project around all the electrodes or around those electrodes which are in the four corners, to prevent displacements that may occur under pressurization. The guide members add to the complexity of the electrode mounting structure.

When electric current is supplied through both ends of the terminal portion, pressure bonding, discrepancy difference between the power supply terminal electrodes can cause a difference in current supply to the OLEDs at the ends. The difference in current supply will in turn result in slightly different luminance levels in the end portions of the display area and hence a luminance gap near the center of the display area, because the luminance distribution generated by the mission of the OLEDs in producing an image display reflects the difference in the current distribution. Display quality may therefore disadvantageously fall in conventional display devices.

In view of the foregoing problems, it is an object of the disclosure to provide a simple structure capable of connecting the power supply terminal electrodes on the terminal portion and the power supply terminal electrodes on the flexible printed board with high precision to restrain display quality deterioration.

Solution to Problem

In order to achieve the object, the disclosure is directed to a display device including: a substrate; a TFT layer on the substrate, the TFT layer including a plurality of TFTs; a plurality of light-emitting elements on the TFT layer, each of the plurality of light-emitting elements including a first electrode, a functional layer, and a second electrode; and a sealing layer provided so as to cover the plurality of light-emitting elements, the display device having: a display area where there are provided a plurality of pixels and a plurality of pixel circuits; and a frame area around the display area, wherein the frame area has an end portion including a first terminal portion including: a plurality of first signal terminal electrodes through which a signal is inputted to the plurality of pixel circuits; and a plurality of first power supply terminal electrodes through which a power supply voltage is inputted to the plurality of pixel circuits, the display device further includes a flexible printed board including a second terminal portion facing the first terminal portion, the second terminal portion includes: a plurality of second signal terminal electrodes electrically connected to the plurality of first signal terminal electrodes via a conductive paste respectively; and a plurality of second power supply terminal electrodes electrically connected to the plurality of first power supply terminal electrodes via a conductive paste respectively, the plurality of first signal terminal electrodes at least partially overlaps at least a part of the plurality of second signal terminal electrodes in a plan view, and the plurality of first power supply terminal electrodes at least partially overlaps at least a part of the plurality of second power supply terminal electrodes in a plan view, and the plurality of first signal terminal electrodes and the plurality of second signal terminal electrodes are parallel to each other, and either the plurality of first power supply terminal electrodes or the plurality of second power supply terminal electrodes is inclined from the other.

Advantageous Effects of Disclosure

According to the disclosure, either the first power supply terminal electrodes in the first terminal portion of the frame area or the second power supply terminal electrodes in the second terminal portion of the flexible printed board are inclined from the others. The disclosure hence provides a simple structure capable of connecting the first power supply terminal electrode and the second power supply terminal electrode with high precision to restrain display quality deterioration.

DESCRIPTION OF EMBODIMENTS

The following will describe embodiments of the disclosure in detail with reference to drawings. The disclosure is by no means limited to these embodiments.

First Embodiment

Figure 1:
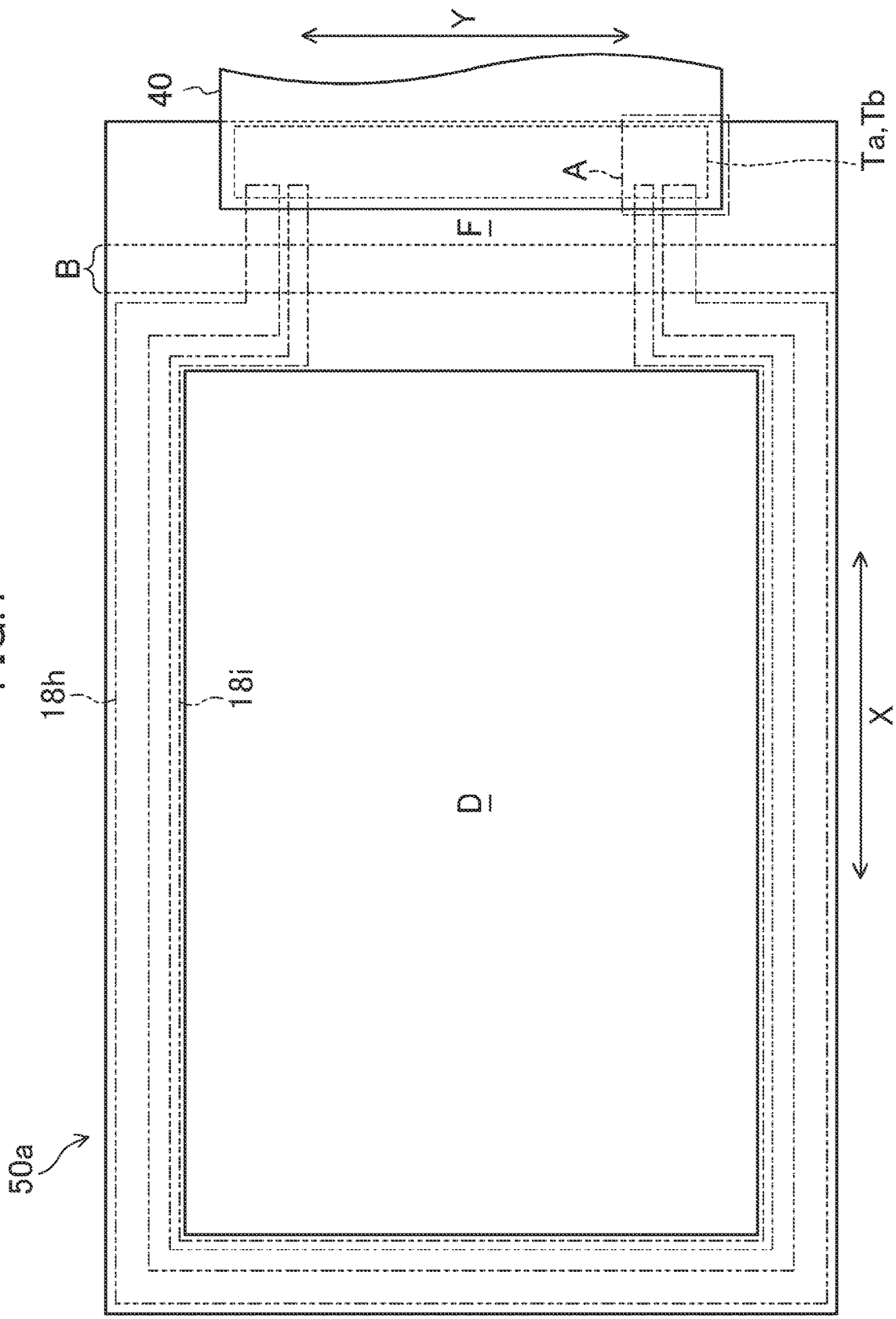
FIG. 1 is a schematic plan view of a structure of an OLED display device in accordance with a first embodiment of the disclosure.
Figure 2:
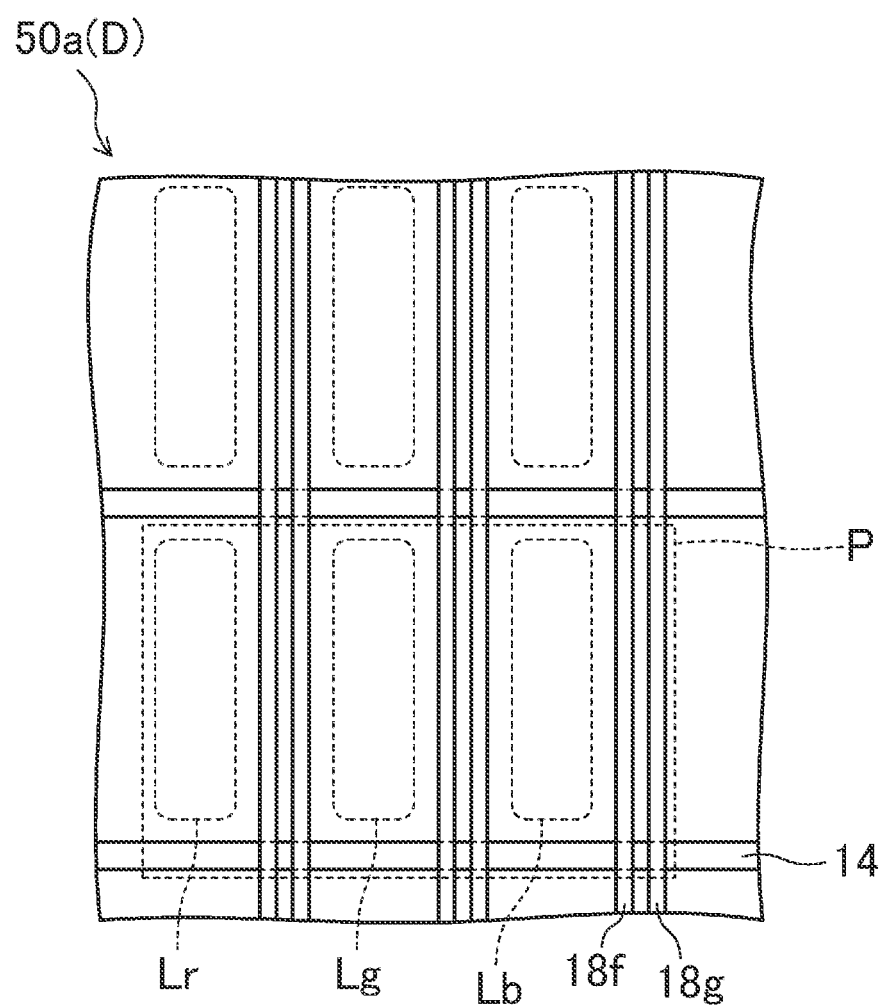
FIG. 2 is a plan view of a display area of the OLED display device in accordance with the first embodiment of the disclosure.
Figure 3:
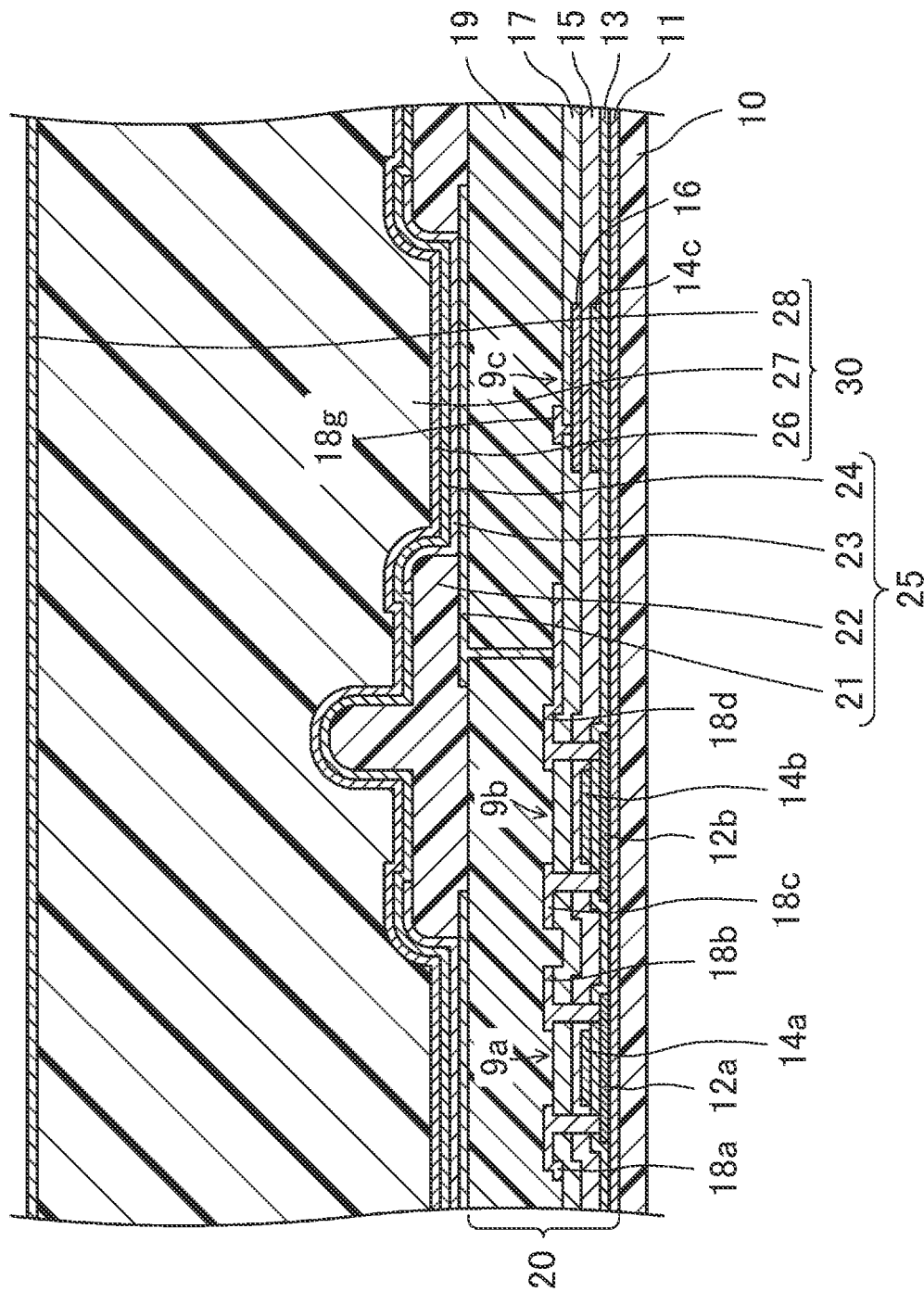
FIG. 3 is a cross-sectional view of the display area of the OLED display device in accordance with the first embodiment of the disclosure.
Figure 4:
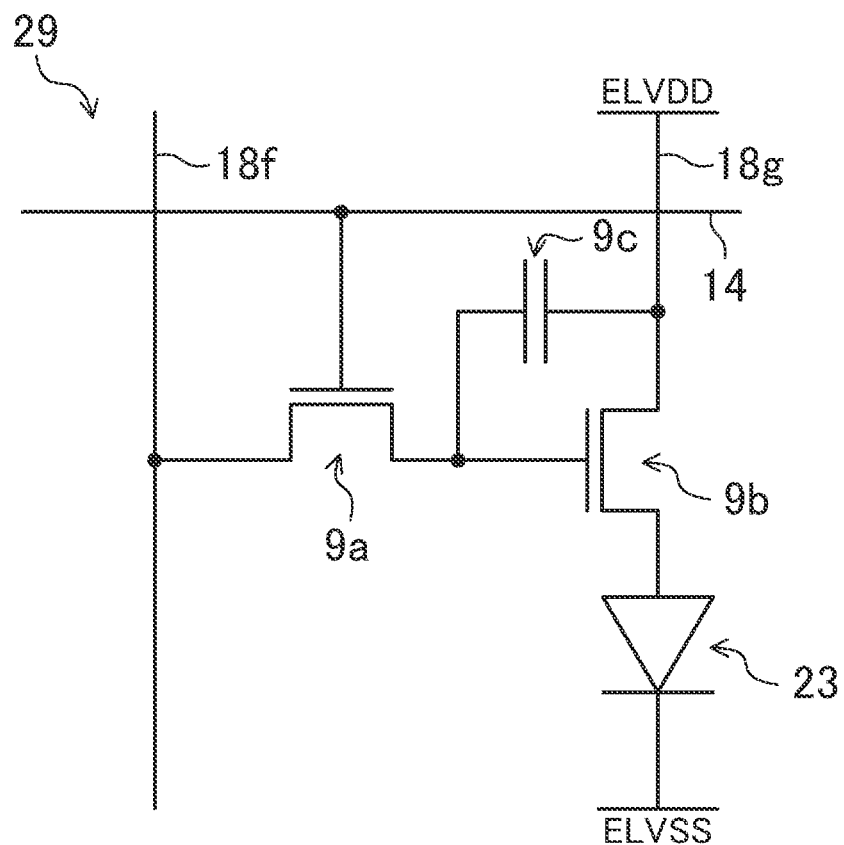
FIG. 4 is an equivalent circuit diagram of one of pixel circuits in the OLED display device in accordance with the first embodiment of the disclosure.
Figure 5:
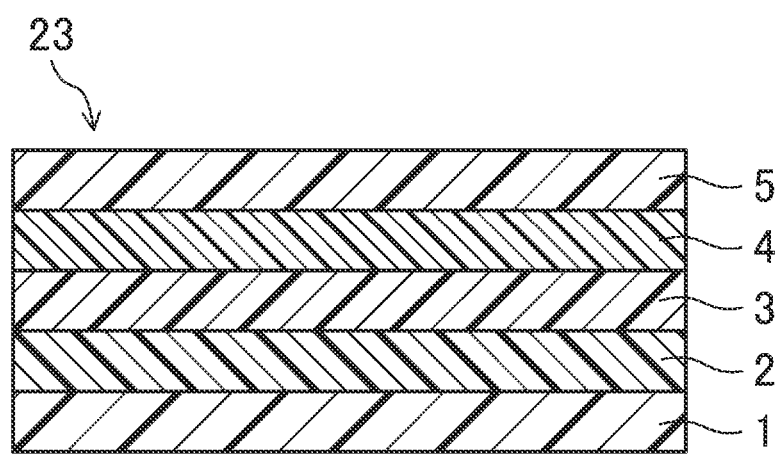
FIG. 5 is a cross-sectional view of an organic light-emitting layer in the OLED display device in accordance with the first embodiment of the disclosure.
Figure 6:
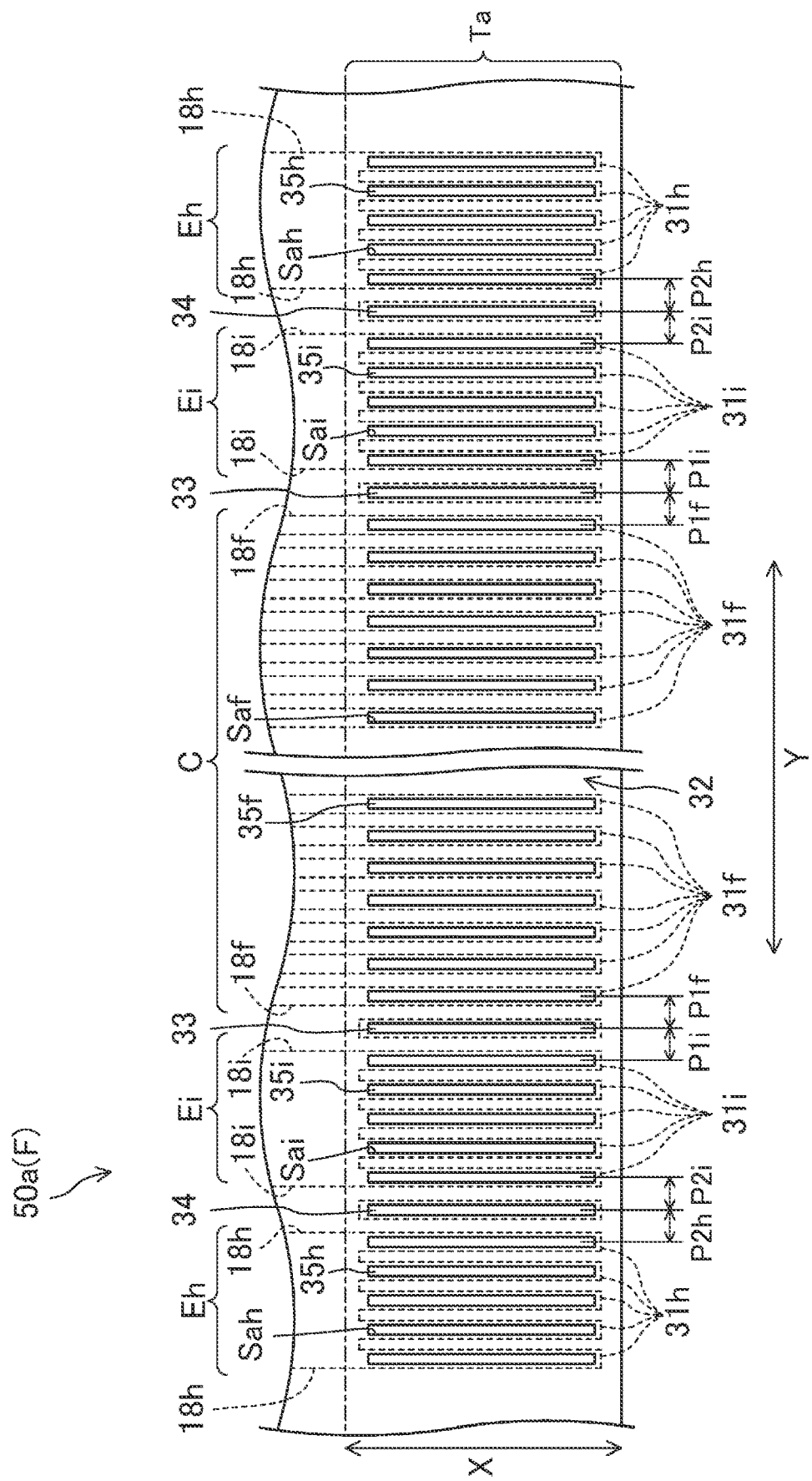
FIG. 6 is an enlarged plan view of a first terminal portion of a frame area of the OLED display device in accordance with the first embodiment of the disclosure.
Figure 7:
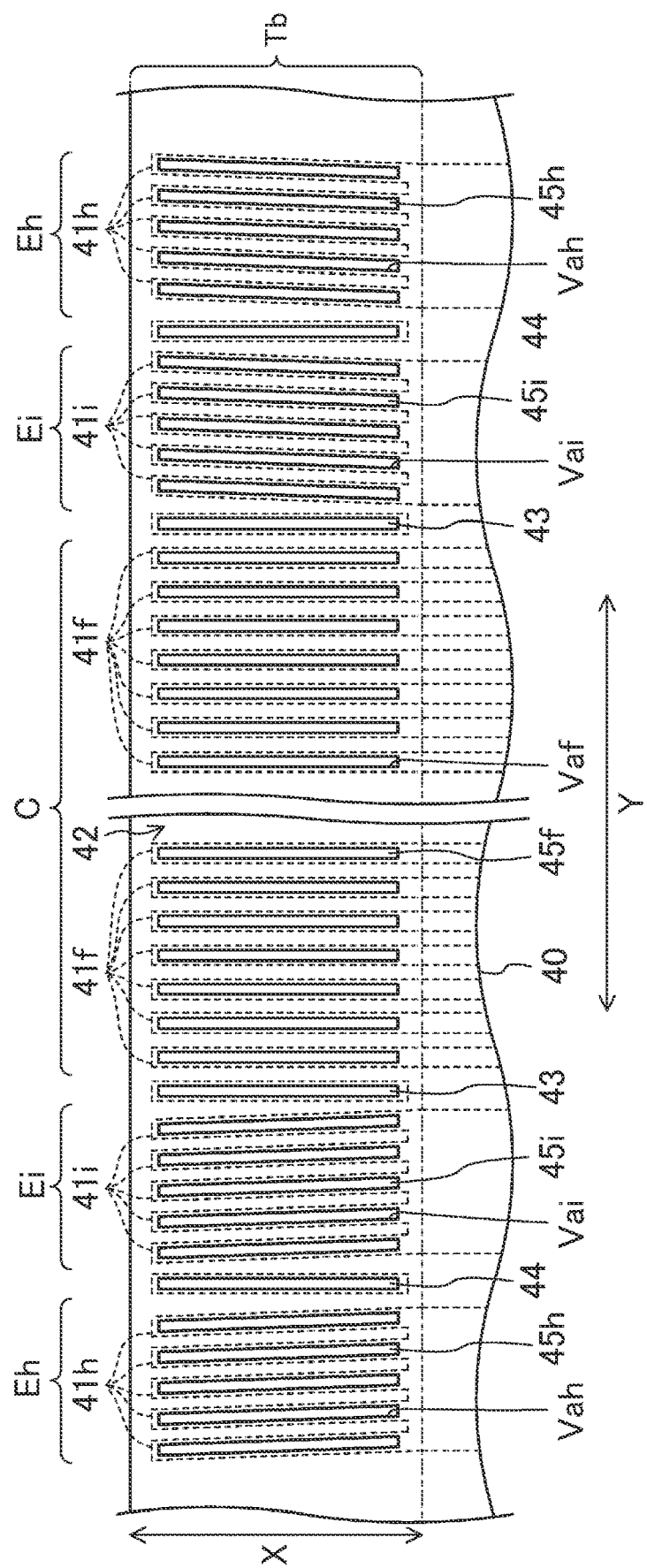
FIG. 7 is an enlarged plan view of a second terminal portion of a flexible printed board in the OLED display device in accordance with the first embodiment of the disclosure.
Figure 8:
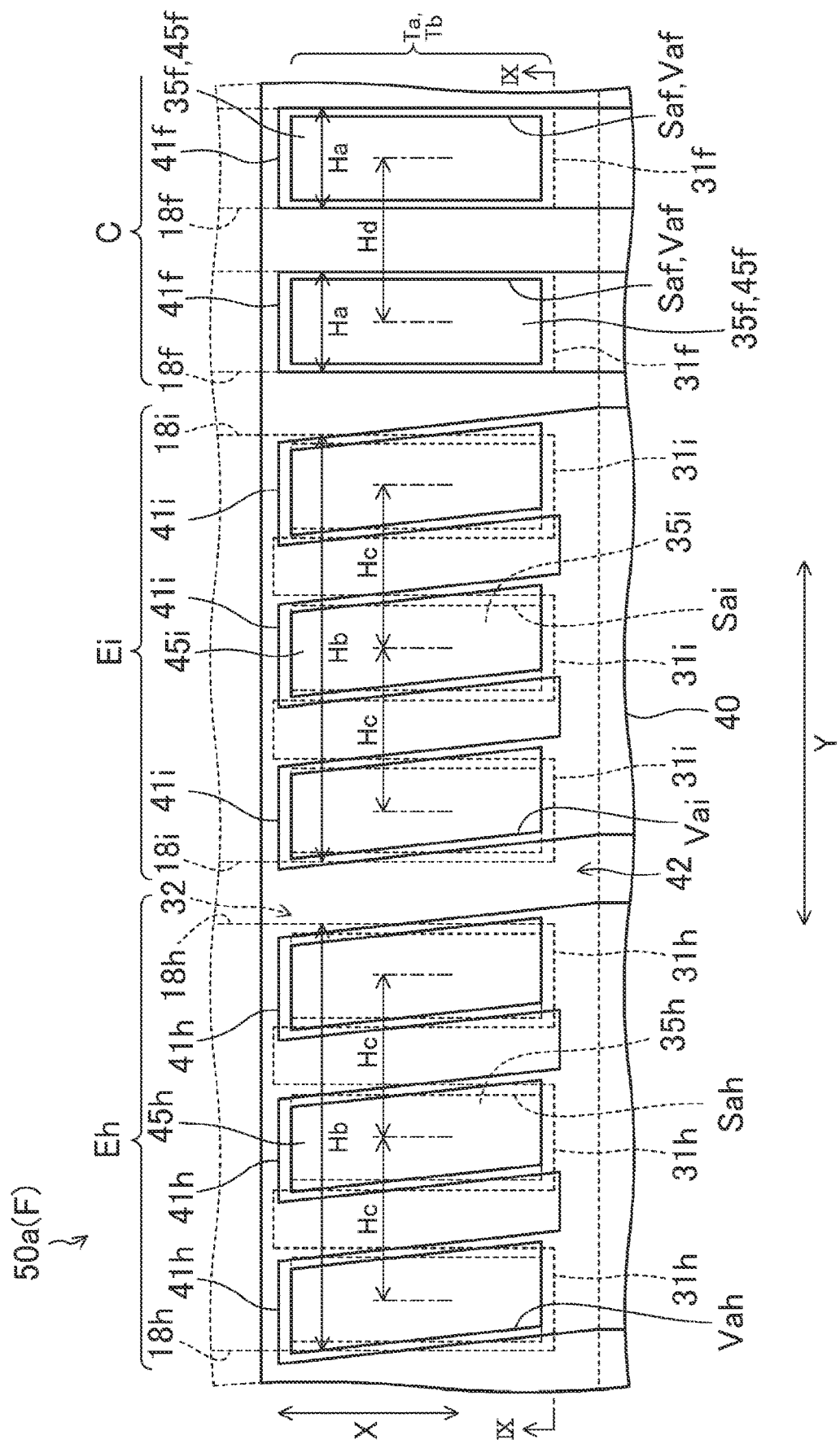
FIG. 8 is a schematic enlarged view of region A shown in FIG. 1, depicting the first terminal portion and the second terminal portion in the OLED display device in accordance with the first embodiment of the disclosure.
Figure 9:
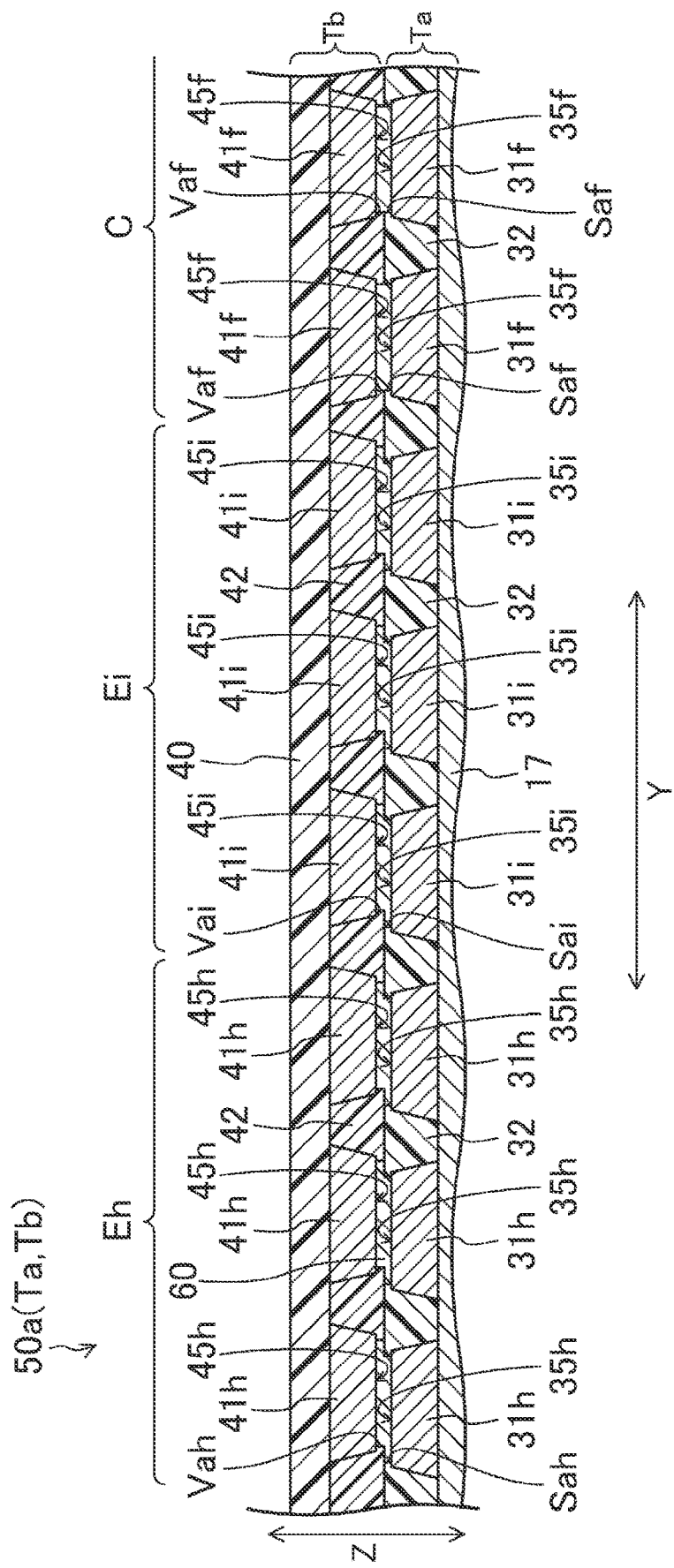
FIG. 9 is a schematic cross-sectional view, taken along line IX-IX in FIG. 8, of the first terminal portion and the second terminal portion in the OLED display device.
Figure 10:
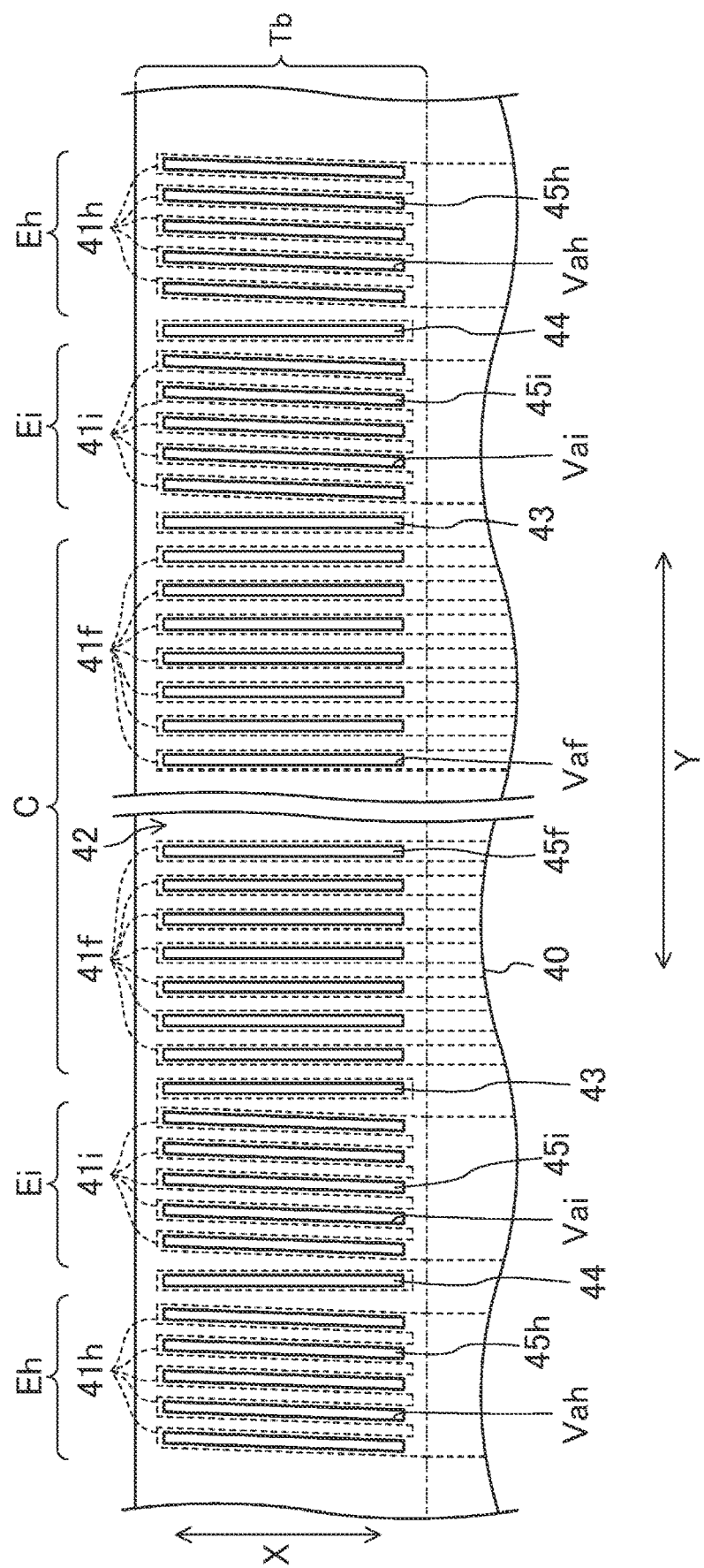
FIG. 10 is an enlarged plan view, equivalent to FIG. 7, of a second terminal portion of a flexible printed board in a first variation example of the OLED display device in accordance with the first embodiment of the disclosure.
Figure 11:
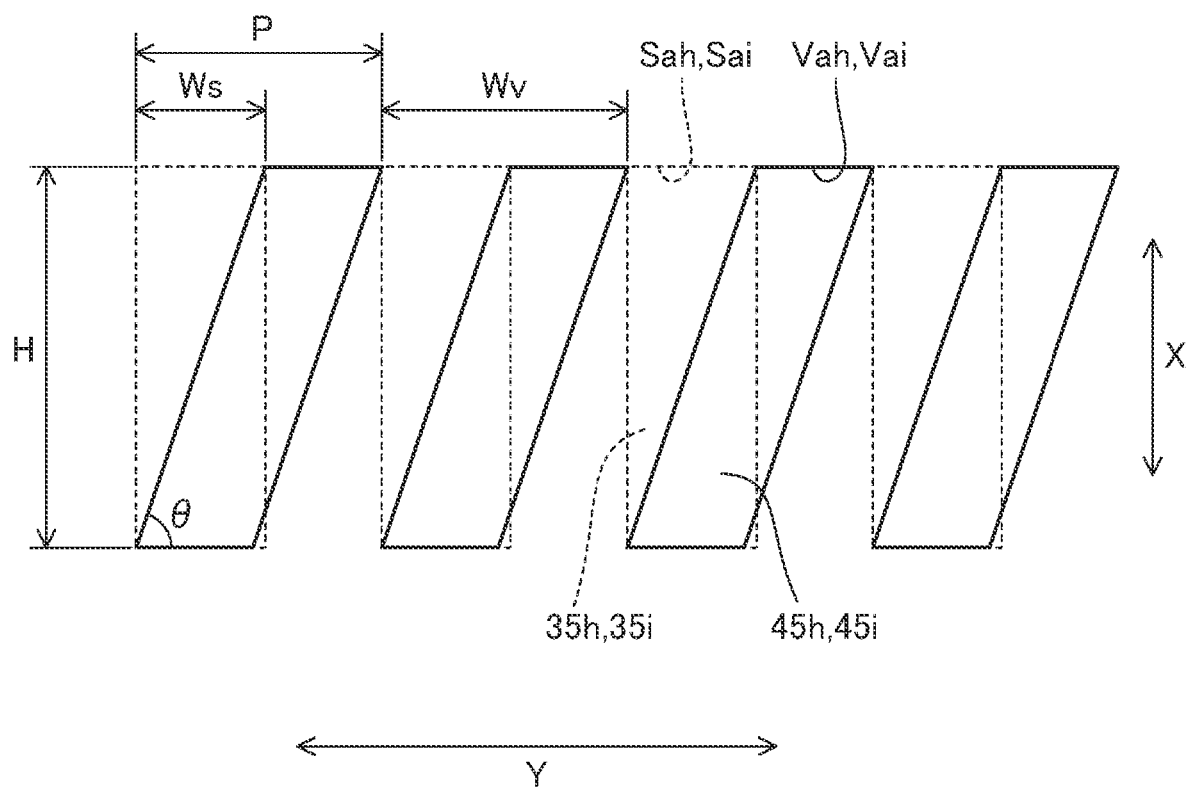
FIG. 11 is a diagram depicting a range of the angle of inclination of second power supply openings with respect to first power supply openings in the OLED display device in accordance with the first embodiment of the disclosure.
Figure 12:
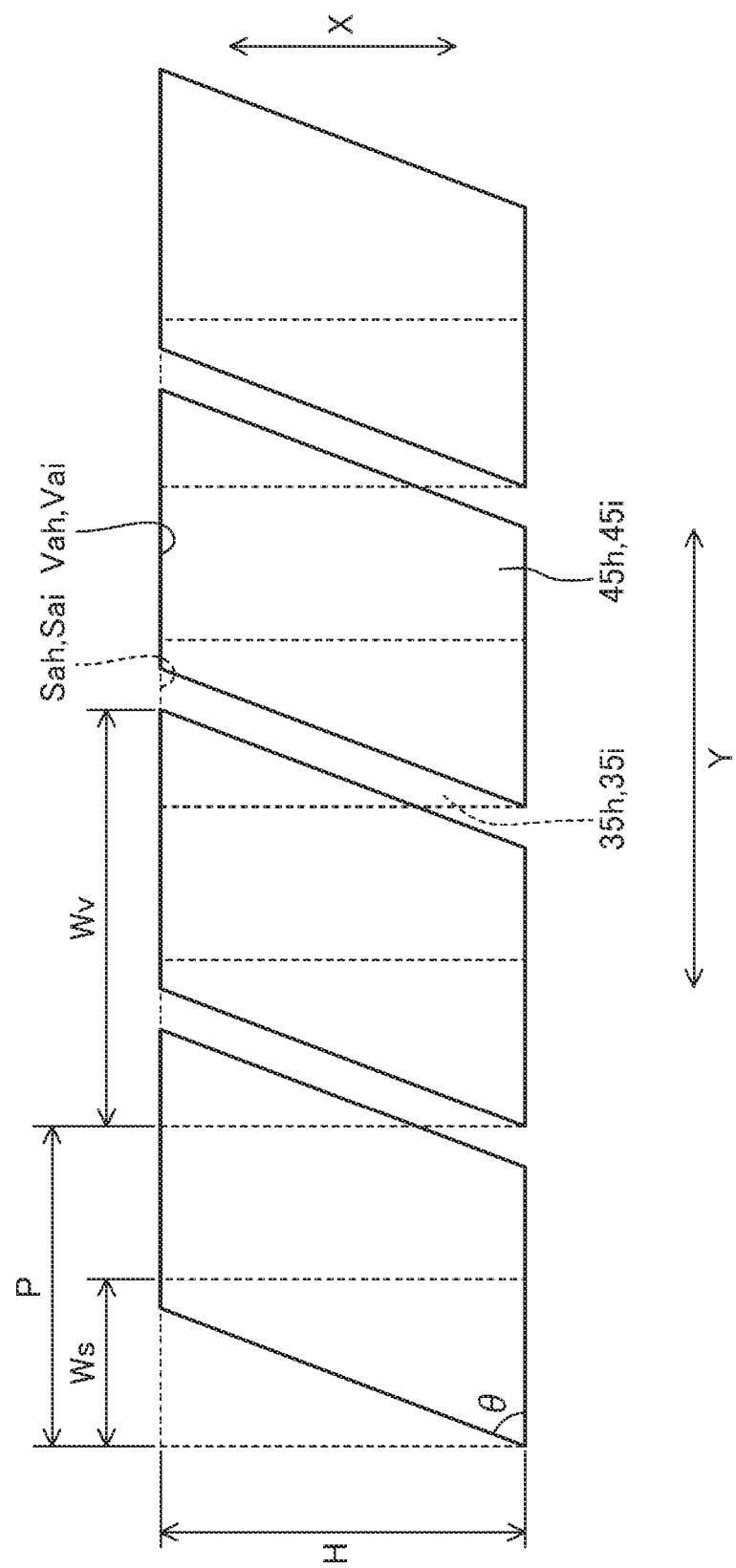
FIG. 12 is a diagram depicting a range of the angle of inclination of the second power supply openings with respect to the first power supply openings in the OLED display device in accordance with the first embodiment of the disclosure.
Figure 13:
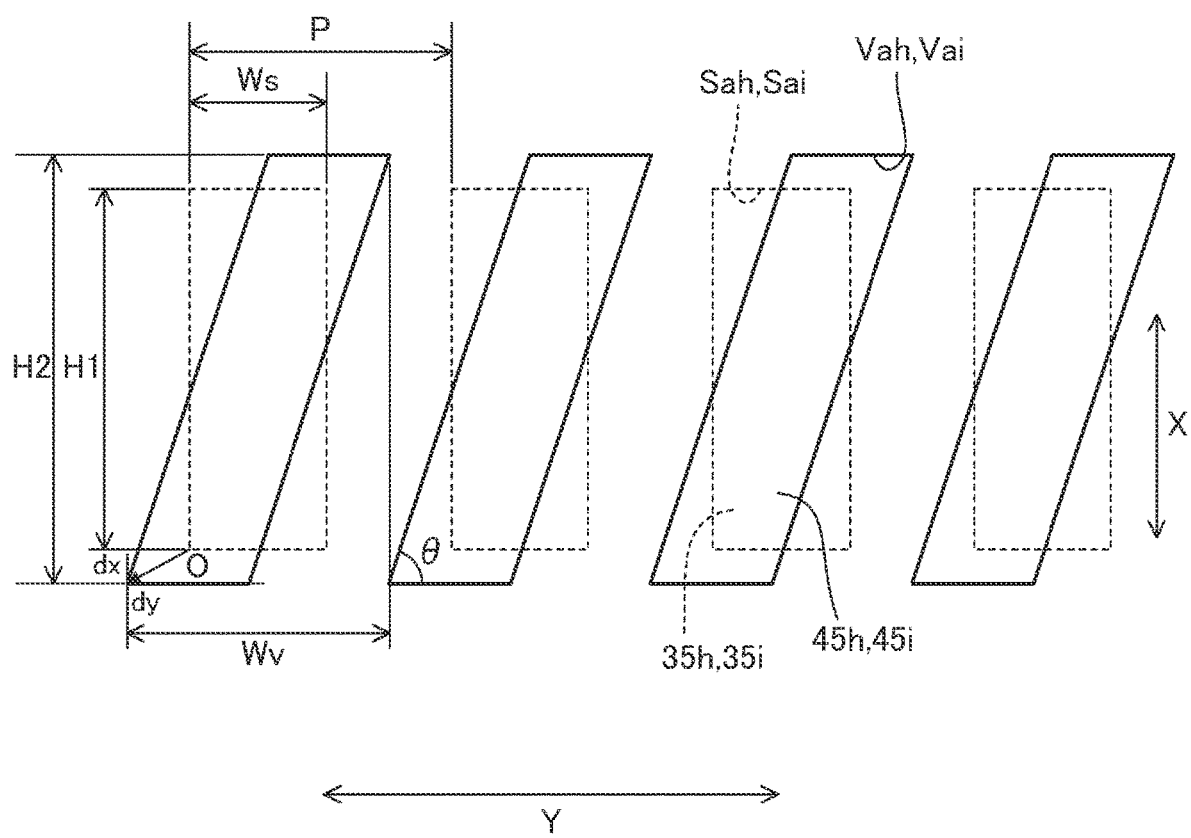
FIG. 13 is a diagram depicting a range of the angle of inclination of the second power supply openings with respect to the first power supply openings in the OLED display device in accordance with the first embodiment of the disclosure.

FIGS. 1 to 13 illuminate a first embodiment of a display device in accordance with the disclosure. The current and subsequent embodiments will discuss OLED display devices including OLEDs as an example of the display device that includes light-emitting elements. FIG. 1 is a schematic plan view of a structure of an OLED display device $50a$ in accordance with the present embodiment. FIG. 2 is a plan view of a display area D of the OLED display device $50a$. FIG. 3 is a cross-sectional view of the display area D of the OLED display device $50a$. FIG. 4 is an equivalent circuit diagram of one of pixel circuits 29 in the OLED display device $50a$. FIG. 5 is a cross-sectional view of an organic light-emitting layer 23 in the OLED display device $50a$. FIG. 6 is an enlarged plan view of a first terminal portion Ta of a frame area F of the OLED display device $50a$. FIG. 7 is an enlarged plan view of a second terminal portion Tb in a flexible printed board 40 of the OLED display device $50a$. FIG. 8 is a schematic enlarged view of region A shown in FIG. 1, depicting the first terminal portion Ta and the second terminal portion Tb in the OLED display device $50a$. FIG. 9 is a schematic cross-sectional view, taken along line IX-IX in FIG. 8, of the first terminal portion Ta and the second terminal portion Tb in the OLED display device $50a$. FIG. 10 is an enlarged plan view, equivalent to FIG. 7, of the second terminal portion Tb of the flexible printed board 40 in a first variation example of the OLED display device $50a$. FIGS. 11, 12, and 13 are diagrams of ranges of the angle of inclination θ of second power supply openings Vah and Vai with respect to first power supply openings Sah and Sai in the OLED display device $50a$.

The OLED display device $50a$, as shown in FIG. 1, has, for example, the rectangular display area D for displaying images and the frame-shaped frame area F around the display area D. The present embodiment will discuss the rectangular display area D as an example. The "rectangular" display area D in the current context however may be "quasi-rectangular" and have, for example, an arched side(s), a round corner(s), and/or a notched side(s).

In the display area D is there provided a matrix of subpixels as shown in FIG. 2. Also in the display area D, for example, a subpixel including a red-light-emitting region Lr for a display in red, a subpixel including a green-light-emitting region Lg for a display in green, and a subpixel including a blue-light-emitting region Lb for a display in blue are provided adjacent to each other as shown in FIG. 2. Each pixel P in the display area D is formed by, for example, three adjacent subpixels including the red-light-emitting region Lr, the green-light-emitting region Lg, and the blue-light-emitting region Lb.

Referring to FIG. 1, the frame area F includes the first terminal portion Ta on the right side thereof. The first terminal portion Ta extends in direction Y is the top-bottom direction in FIG. 1. Still referring to FIG. 1, the frame area F further includes a bending portion B extending parallel to direction Y between the display area D and the first terminal portion Ta. The bending portion B can be bent by 180° along direction Y which is the top-bottom direction in FIG. 1 (to form a "U" shape). The flexible printed board 40, which will be described later, is attached to the first terminal portion Ta as shown in FIG. 1. The second terminal portion Tb, which will be described later, is provided on one of the sides of the flexible printed board 40 so as to extend in direction Y. In the OLED display device 50a, besides direction Y, direction X is defined that is both perpendicular to direction Y and parallel to the surface of a resin substrate layer 10 as shown in FIG. 1. The resin substrate layer 10 will be described later.

The OLED display device 50a includes, as shown in FIG. 3, the resin substrate layer 10, a TFT layer 20, OLEDs 25, and a sealing layer 30. The resin substrate layer 10 serves as a substrate. The TFT layer 20 resides on the resin substrate layer 10 and includes a plurality of TFTs (thin film transistors). The OLEDs 25 resides on the TFT layer 20 as light-emitting elements forming the display area D. The sealing layer 30 covers the OLEDs 25.

The resin substrate layer 10 is made of, for example, a polyimide resin. The substrate may be, for example, a glass substrate.

The TFT layer 20 includes: a base coat film 11 on the resin substrate layer 10; a first TFT 9a, a second TFT 9b, and a capacitor 9c as the pixel circuit 29 (see FIG. 4) in each subpixel on the base coat film 11; and a TFT planarization film 19 on the first TFTs 9a, the second TFTs 9b, and the capacitors 9c, as shown in FIG. 3. The pixel circuits 29, each associated with a different subpixel, are arranged in a matrix in the TFT layer 20. The TFT layer 20 includes a plurality of gate lines 14 extending parallel to each other in the left-right direction in FIGS. 2 and 4, as shown in FIGS. 2 and 4. The TFT layer 20 further includes a plurality of source lines 18f extending parallel to each other in the top-bottom direction in FIGS. 2 and 4, as shown in FIGS. 2 and 4. The TFT layer 20 further includes a plurality of power supply lines 18g extending parallel to each other in the top-bottom direction in FIGS. 2 and 4, as shown in FIGS. 2 and 4. Each power supply line 18g is provided adjacent to an associated one of the source lines 18f as shown in FIG. 2.

The base coat film 11 includes either a single inorganic insulation film of, for example, silicon nitride, silicon oxide, or silicon oxynitride or a stack of any of these inorganic insulation films.

Each first TFT 9a is electrically connected to an associated one of the gate lines 14 and an associated one of the source lines 18f in each subpixel as shown in FIG. 4. The first TFT 9a includes a semiconductor layer 12a, a gate insulation film 13, a gate electrode 14a, a first interlayer insulation film 15, a second interlayer insulation film 17, a source electrode 18a, and a drain electrode 18b all on the base coat film 11 in this order as shown in FIG. 3. The semiconductor layer 12a is, for example, a polysilicon film provided in an insular manner on the base coat film 11 as shown in FIG. 3 and includes channel regions, source regions, and drain regions. The gate insulation film 13 is provided so as to cover the semiconductor layer 12a as shown in FIG. 3. The gate electrode 14a is provided on the gate insulation film 13 so as to overlap the channel region in the semiconductor layer 12a as shown in FIG. 3. The first interlayer insulation film 15 and the second interlayer insulation film 17 are provided in this order so as to cover the gate electrode 14a as shown in FIG. 3. The source electrode 18a and the drain electrode 18b are provided on the second interlayer insulation film 17 so as to be separated from each other as shown in FIG. 3. The source electrode 18a and the drain electrode 18b are electrically connected respectively to a source region and a drain region in the semiconductor layer 12a via contact holes formed through the stack of the gate insulation film 13, the first interlayer insulation film 15, and the second interlayer insulation film 17, as shown in FIG. 3.

The gate insulation film 13, the first interlayer insulation film 15, and the second interlayer insulation film 17 each include either a single inorganic insulation film of, for example, silicon nitride, silicon oxide, or silicon oxynitride or a stack of any of these inorganic insulation films.

Each second TFT 9b is electrically connected to an associated one of the first TFTs 9a and an associated one of the power supply lines 18g in each subpixel as shown in FIG. 4. The second TFT 9b includes a semiconductor layer 12b, the gate insulation film 13, a gate electrode 14b, the first interlayer insulation film 15, the second interlayer insulation film 17, a source electrode 18c, and a drain electrode 18d all on the base coat film 11 in this order as shown in FIG. 3. The semiconductor layer 12b is, for example, a polysilicon film provided in an insular manner on the base coat film 11 as shown in FIG. 3 and includes channel regions, source regions, and drain regions. The gate insulation film 13 is provided so as to cover the semiconductor layer 12b as shown in FIG. 3. The gate electrode 14b is provided on the gate insulation film 13 so as to overlap the channel region in the semiconductor layer 12b as shown in FIG. 3. The first interlayer insulation film 15 and the second interlayer insulation film 17 are provided in this order so as to cover the gate electrode 14b as shown in FIG. 3. The source electrode 18c and the drain electrode 18d are provided on the second interlayer insulation film 17 so as to be separated from each other as shown in FIG. 3. The source electrode 18c and the drain electrode 18d are electrically connected respectively to a source region and a drain region in the semiconductor layer 12b via contact holes formed through the stack of the gate insulation film 13, the first interlayer insulation film 15, and the second interlayer insulation film 17, as shown in FIG. 3.

The first TFTs 9a and the second TFTs 9b are top-gate TFTs as an example in the present embodiment, but may alternatively be bottom-gate TFTs.

Each capacitor 9c is electrically connected to an associated one of the first TFTs 9a and an associated one of the power supply lines 18g in each subpixel as shown in FIG. 4. The capacitor 9c includes: a lower conductive layer 14c made of the same material and in the same layer as the gate electrodes 14a and 14b; the first interlayer insulation film 15 provided so as to cover the lower conductive layer 14c; and an upper conductive layer 16 provided on the first interlayer insulation film 15 so as to overlap the lower conductive layer 14c, as shown in FIG. 3. The upper conductive layer 16 is electrically connected to the power supply line 18g via a contact hole formed through the second interlayer insulation film 17, as shown in FIG. 3.

The planarization film 19 is made of, for example, an organic resin material such as a polyimide resin.

The OLEDs 25 include a plurality of first electrodes 21, an edge cover 22, the organic light-emitting layers (functional layers) 23, and a plurality of second electrodes 24 all on the planarization film 19 in this order as shown in FIG. 3.

The first electrodes 21 are associated with the respective subpixels and arranged in a matrix on the planarization film 19 as shown in FIG. 3. Each first electrode 21 is electrically connected to the drain electrode 18d of the second TFT 9b via a contact hole formed through the planarization film 19 as shown in FIG. 3. The first electrode 21 has a function of injecting holes to the organic light-emitting layer 23. The first electrode 21 is preferably formed of a material that has a large work function in order to improve the efficiency of hole injection to the organic light-emitting layer 23. The first electrode 21 is made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). The first electrode 21 may alternatively be made of, for example, an alloy such as astatine-astatine oxide (At—$AtO_2$). As another alternative, the first electrode 21 may be made of, for example, an electrically conductive oxide such as tin oxide (SnO), zinc oxide (ZnO), indium tin oxides (ITO), or indium zinc oxide (IZO). As a further alternative, the first electrode 21 may be a stack of layers of any of these materials. Examples of compound materials that have a large work function include indium tin oxide (ITO) and indium zinc oxide (IZO).

The edge cover 22 is arranged to form a lattice covering the peripheries of the first electrodes 21 as shown in FIG. 3. The edge cover 22 may be made of, for example, a positive photosensitive resin such as polyimide resin, acrylic resin, polysiloxane resin, or novolac resin. Parts of the surface of the edge cover 22 protrude upwards in FIG. 3 as shown in FIG. 3, to provide insular pixel photo spacers.

The organic light-emitting layers 23, one for each sub-pixel, are arranged in a matrix on the first electrodes 21 as shown in FIG. 3. Each organic light-emitting layer 23 includes a hole injection layer 1, a hole transport layer 2, a light-emitting layer 3, an electron transport layer 4, and an electron injection layer 5 all on the first electrode 21 in this order as shown in FIG. 5.

The hole injection layer 1, alternatively referred to as the anode buffer layer, has a function of bringing the energy levels of the first electrode 21 and the organic light-emitting layer 23 closer to each other to improve the efficiency of hole injection from the first electrode 21 to the organic light-emitting layer 23. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transport from the first electrode 21 to the organic light-emitting layer 23. The hole transport layer 2 is made of, for example, a porphyrin derivative, an aromatic tertiary amine compound, a styryl amine derivative, polyvinyl carbazole, poly-p-phenylene vinylene, polysilane, a triazole derivative, ab oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 21 and the second electrode 24 respectively when the light-emitting layer 3 is under voltage applied by the first electrode 21 and the second electrode 24. These injected holes and electrons recombine in the light-emitting layer 3. The light-emitting layer 3 is made of a material that has a high light-emission efficiency. The light-emitting layer 3 is made of, for example, a metal oxinoid compound [8-hydroxy quinoline metal complex], a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styryl amine derivative, a bis(styryl)benzene derivative, a tris(styryl)benzene derivative, a perylene derivative, a perynone derivative, an amino pyrene derivative, a pyridine derivative, a rhodamine derivative, an acridine derivative, phenoxazone, a quinacridone derivative, rubrene, poly-p-phenylene vinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 24 and the organic light-emitting layer 23 closer to each other to improve the efficiency of electron injection from the second electrode 24 to the organic light-emitting layer 23. This function can lower the drive voltage of the OLED 25. The electron injection layer 5, alternatively referred to as the cathode buffer layer, is made of, for example, an inorganic alkali compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); or strontium oxide (SrO).

The second electrode 24 is provided so as to cover the organic light-emitting layer 23 and the edge cover 22 as shown in FIG. 3. The second electrode 24 has a function of injecting electrons to the organic light-emitting layer 23. The second electrode 24 is more preferably made of a material that has a small work function in order to improve the efficiency of electron injection to the organic light-emitting layer 23. The second electrode 24 is made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). The second electrode 24 may alternatively be made of, for example, a magnesium-copper (Mg—Cu) alloy, a magnesium-silver (Mg—Ag) alloy, a sodium-potassium (Na—K) alloy, an astatine-astatine oxide (At—$AtO_2$), a lithium-aluminum (Li—Al) alloy, a lithium-calcium-aluminum (Li—Ca—Al) alloy; or a lithium fluoride-calcium-aluminum (LiF—Ca—Al) alloy. As another alternative, the second electrode 24 may be made of, for example, an electrically conductive oxide such as tin oxide (SnO), zinc oxide (ZnO), indium tin oxide (ITO), or indium zinc oxide (IZO). As a further alternative, the second electrode 24 may be a stack of layers of any of these materials. Examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

The sealing layer 30 includes: a first inorganic insulation film 26 provided so as to cover the second electrodes 24; an organic film 27 on the first inorganic insulation film 26; and a second inorganic insulation film 28 provided so as to cover the organic film 27, as shown in FIG. 3. The sealing layer 30 has a function of protecting the organic light-emitting layer 23 from, for example, water and oxygen. The first inorganic insulation film 26 and the second inorganic insulation film 28 are made of, for example, an inorganic material such as silicon oxide ($SiO_2$), aluminum oxide ($Al_2O_3$), silicon nitride ($SiN_x$ where x is a positive number) (e.g., trisilicon tetranitride ($Si_3N_4$), or silicon carbide nitride (SiCN). The organic film 27 is made of, for example, an organic material such as an acrylic resin, a polyurea resin, a parylene resin, a polyimide resin, or a polyamide resin.

The OLED display device 50a includes a plurality of first signal terminal electrodes 31f and a plurality of first power supply terminal electrodes 31h and 31i along the direction in which the first terminal portion Ta extends (direction Y) in the first terminal portion Ta, as shown in FIGS. 6, 8, and 9. Each pixel circuit 29 (see FIG. 4) is fed with a data signal through an associated one of the first signal terminal electrodes 31f and with a power supply voltage through an associated one of the first power supply terminal electrodes 31h and an associated one of the first power supply terminal electrodes 31i. As shown in FIGS. 6, 8, and 9, the first signal terminal electrodes 31f reside in a middle portion C of the first terminal portion Ta in terms of direction Y. Meanwhile, the first power supply terminal electrodes 31h and 31i reside in end portions Eh and Ei of the first terminal portion Ta in terms of direction Y. In other words, the first signal terminal electrodes 31f are flanked by the first power supply terminal electrodes 31h and 31i. Still referring to FIGS. 6, 8, and 9, the first power supply terminal electrodes 31h reside in the end portions Eh which are closer to the far ends of the first terminal portion Ta (closer to the exterior) in terms of direction Y than are the end portions Ei in terms of direction Y where the first power supply terminal electrodes 31i reside.

The first signal terminal electrodes 31f and the first power supply terminal electrodes 31h and 31i are provided to extend parallel to each other in direction X as shown in FIGS. 6 and 8. In other words, the first power supply terminal electrodes 31h and the first power supply terminal electrodes 31i are provided parallel to each other in direction X.

The first signal terminal electrodes 31f are electrically connected to the source lines 18f that have a line width equal to Ha (see FIG. 8). The first signal terminal electrodes 31f provide a plurality of routing lines (18f) electrically connected to the source lines 18f on the display area D side. The routing lines (18f) are continuous all the way to the first signal terminal electrode 31f. The routing lines may have a diode built around transistors interposed between a terminal and the line (near a terminal) to remove noise on input signals and are still considered as "continuous" for the purpose of this specification and consistent with the object of the disclosure.

The first power supply terminal electrodes 31h are electrically connected to low-voltage power supply main lines 18h that are fed with a low-voltage power supply (ELVSS). The main lines 18h have a line width equal to Hb (>Ha, see FIG. 8). The first power supply terminal electrodes 31h are also electrically connected to the second electrodes 24 via the low-voltage power supply main lines 18h. The low-voltage power supply main lines 18h are routed in the frame area F, substantially like a letter "C" skirting around the display area D in a plan view as shown in FIG. 1. The low-voltage power supply main lines 18h are continuous all the way to the first power supply terminal electrodes 31h. The first power supply terminal electrodes 31h and the low-voltage power supply main lines 18h are made of the same material and in the same layer as the source lines 18f.

The first power supply terminal electrodes 31i are electrically connected to high-voltage power supply main lines 18i that are led with a high-voltage power supply (ELVDD). The main lines 18i have a line width equal to Hb (see FIG. 8). The first power supply terminal electrodes 31i are also electrically connected to the power supply lines 18g and the first electrodes 21 via the high-voltage power supply main lines 18i. The high-voltage power supply main lines 18i are routed in the frame area F, substantially like a letter "C" skirting around the display area D in a plan view as shown in FIG. 1. The high-voltage power supply main lines 18i reside internal to the low-voltage power supply main lines 18h. The high-voltage power supply main lines 18i are continuous all the way to the first power supply terminal electrodes 31i. The first power supply terminal electrodes 31i and the high-voltage power supply main lines 18i are made of the same material and in the same layer as the source lines 18f. The power supply lines 18g are pulled out to the first terminal portion Ta to provide a plurality of routing lines (18g) electrically connected to the power supply lines 18g on the display area D side. The routing lines (18g) are continuous all the way to the first power supply terminal electrodes 31i.

The first power supply terminal electrodes 31h branch off the low-voltage power supply main lines 18h in the first terminal portion Ta as shown in FIGS. 6 and 8 (five and three first power supply terminal electrodes 31h branch off a low-voltage power supply main line 18h in FIGS. 6 and 8 respectively). In other words, the branching, first power supply terminal electrodes 31h have a line width equal to Ha (see FIG. 8). The first power supply terminal electrodes 31i branch off the high-voltage power supply main lines 18i in the first terminal portion Ta as shown in FIGS. 6 and 8 (five and three first power supply terminal electrodes 31i branch off a high-voltage power supply main line 18i in FIGS. 6 and 8 respectively). In other words, the branching, first power supply terminal electrodes 31i have a line width equal to Ha (see FIG. 8). The branching, first power supply terminal electrodes 31h and 31i have a pitch equal to He (see FIG. 8), and the first signal terminal electrodes 31f have a pitch equal to Hd (see FIG. 8). He is equal to Hd.

The OLED display device 50a includes a planarization film 32 in the first terminal portion Ta so as to cover the first signal terminal electrodes 31f and the first power supply terminal electrodes 31h and 31i as shown in FIGS. 6, 8, and 9. The planarization film 32 has: a plurality of first signal openings Saf where the first signal terminal electrodes 31f are at least partially exposed; and the plurality of first power supply openings Sah and Sai where the branching, first power supply terminal electrodes 31h and 31i are at least partially exposed. The planarization film 32 is made of the same material and in the same layer as the planarization film 19 for the TFTs.

The first signal opening Saf is formed in a rectangular shape in a plan view along the periphery of the first signal terminal electrode 31f as shown in FIGS. 6 and 8. Meanwhile, the first power supply opening Sah is formed in a rectangular shape in a plan view along the periphery of the brandling, first power supply terminal electrode 31h. The first power supply opening Sai is formed in a rectangular shape in a plan view along the periphery of the branching, first power supply terminal electrode 31i. The planar shapes of the openings Saf, Sah, and Sai are not necessarily rectangular as shown in the figures and may be, for example, octagonal or otherwise polygonal, trapezoidal, or elliptical.

As described here, in the OLED display device 50a, as shown in FIGS. 6, 8, and 9, there is provided a first signal terminal 35f in a location where the first signal terminal electrode 31f is exposed in the first signal opening Saf. There is provided a first power supply terminal 35h in a location where the branching, first power supply terminal electrode 31h is exposed in the first power supply opening Sah. There is provided a first power supply terminal 35i in a location where the branching, first power supply terminal electrode 31i is exposed in the first power supply opening Sai.

The OLED display device 50a further includes a first dummy terminal 33 between the first signal terminal electrode 31f and the adjacent, first power supply terminal electrode 31i as shown in FIG. 6. The first dummy terminal 33 is provided parallel to the direction in which the first signal terminal electrode 31f and the first power supply terminal electrode 31i extend (direction X) as shown in FIG. 6. The first dummy terminal 33 is not electrically connected to the first signal terminal electrode 31f and the first power supply terminal electrode 31i. This lack of electrical connection prevents short-circuiting between the first signal terminal electrode 31f and the first power supply terminal electrode 31i. The first dummy terminal 33 is separated from the adjacent, first signal terminal electrode 31f by a pitch P1f and from the adjacent, first power supply terminal electrode 31i by a pitch P1i that is equal to the pitch P1f, as shown in FIG. 6. The first dummy terminal 33 is made of the same material and in the same layer as the first signal terminal electrode 31f and the first power supply terminal electrodes 31h and 31i.

The OLED display device 50a further includes a second dummy terminal 34 between the first power supply terminal electrode 31h and the adjacent, first power supply terminal electrode 31i as shown in FIG. 6. The second dummy terminal 34 is provided parallel to the direction in which the first power supply terminal electrode 31h and the first power supply terminal electrode 31i extend (direction X) as shown in FIG. 6. The second dummy terminal 34 is not electrically connected to the first power supply terminal electrode 31h and the first power supply terminal electrode 31i. This lack of electrical connection prevents short-circuiting between the first power supply terminal electrode 31h and the first power supply terminal electrode 31i. The second dummy terminal 34 is separated from the adjacent, first power supply terminal electrode 31h by a pitch P2h and from the adjacent, first power supply terminal electrode 31i by a pitch P2i that is equal to the pitch P2h, as shown in FIG. 6. The second dummy terminal 34 is made of the same material and in the same layer as the first signal terminal electrode 31f and the first power supply terminal electrodes 31h and 31i.

The OLED display device 50a may include, at both ends (outside) of the first power supply terminal electrode 31h in terms of direction Y, a dummy terminal that is not electrically connected to the first power supply terminal electrode 31h.

In the OLED display device 50a, the flexible printed board 40 is attached to the first terminal portion Ta by pressure bonding through a conductive paste 60 as shown in FIGS. 1, 8, and 9. The conductive paste 60 is, for example, an anisotropic conductive film (ACF). FIGS. 8 and 9 show no dummy terminals 33 and 34 and no dummy terminals 43 and 44 which will be described later. FIG. 8 indicates the first terminal portion Ta of the frame area F with a dotted line and the second terminal portion Tb of the flexible printed board 40 with a solid line.

Referring to FIGS. 1, 8, and 9, in the flexible printed board 40, the second terminal portion Tb resides facing the first terminal portion Ta at the pressure-bonded end of the first terminal portion Ta and extends in the top-bottom direction in the figure (direction Y). The second terminal portion Tb includes a plurality of second signal terminal electrodes 41f, a plurality of second power supply terminal electrodes 41h, and a plurality of second power supply terminal electrodes 41i all extending in the direction in which the second terminal portion Tb extends (direction Y), as shown in FIGS. 7 to 9. The second signal terminal electrode 41f and the second power supply terminal electrodes 41h and 41i are made of the same material as the source line 18f.

More specifically, as shown in FIGS. 7 to 9, each second signal terminal electrode 41f is positioned to match, and electrically connected to, an associated one of the first signal terminal electrodes 31f through the conductive paste 60. Each second power supply terminal electrode 41h is positioned to match, and electrically connected to, an associated one of the branching, first power supply terminal electrodes 31h through the conductive paste 60. Each second power supply terminal electrode 41i is positioned to match, and electrically connected to, an associated one of the branching, first power supply terminal electrodes 31i through the conductive paste 60.

More specifically, as shown in FIGS. 7 to 9, the second signal terminal electrode 41f resides in the middle portion C in terms of direction Y. In contrast, the second power supply terminal electrodes 41h and 41i reside in the end portions Eh and Ei in terms of direction Y. The second power supply terminal electrode 41h resides in the end portions Eh which are closer to the far ends (closer to the exterior) in terms of direction than are the end portions Ei in terms of direction Y where the second power supply terminal electrodes 41i reside, as shown in FIGS. 7 to 9.

The OLED display device 50a further includes an insulation film 42 in the second terminal portion Tb so as to cover the second signal terminal electrodes 41f and the second power supply terminal electrodes 41h and 41i as shown in FIGS. 7 to 9. The insulation film 42 has: a plurality of second signal openings Vaf where the second signal terminal electrodes 41f are at least partially exposed; the plurality of second power supply openings Vah where the second power supply terminal electrodes 41h are at least partially exposed; and the plurality of second power supply openings Vai where the second power supply terminal electrodes 41i are at least partially exposed. The insulation film 42 includes either a single inorganic insulation film of, for example, silicon nitride, silicon oxide, or silicon oxynitride or a stack of any of these inorganic insulation films.

The second signal opening Vaf is formed along the periphery of the second signal terminal electrode 41f. The second power supply opening Vah is formed along the periphery of the second power supply terminal electrode 41h. The second power supply opening Vai is formed along the periphery of the second power supply terminal electrode 41i.

As described here, in the OLED display device 50a, there is provided a second signal terminal 45f in a location where the second signal terminal electrode 41f is exposed in the second signal opening Vaf. There is provided a second power supply terminal 45h in a location where the second power supply terminal electrode 41h is exposed in the second power supply opening Vah. There is provided a second power supply terminal 45i in a location where the second power supply terminal electrode 41i is exposed in the second power supply opening Vai. The second signal opening Vaf has the same length as the first signal opening Saf in the longer-side direction (direction X) thereof as shown in FIG. 8.

The third dummy terminals 43 and the fourth dummy terminals 44 in the OLED display device 50a are provided in those locations in the second terminal portion Tb which correspond to those of the first dummy terminals 33 and the second dummy terminals 34 and with the same pitches as the first dummy terminals 33 and the second dummy terminals 34 as shown in FIG. 7. The third dummy terminal 43 is not electrically connected to the second signal terminal electrode 41f and the second power supply terminal electrode 41i. The fourth dummy terminal 44 is not electrically connected to the second power supply terminal electrode 41h and the second power supply terminal electrode 41i. The second power supply terminal electrode 41h may include, at both ends (outside) thereof in terms of direction Y, a dummy terminal that is not electrically connected to the second power supply terminal electrode 41h.

In the OLED display device 50a, as shown in FIGS. 8 and 9, the first signal terminal electrode 31f at least partially overlaps at least a part of the second signal terminal electrode 41f in a plan view. The first power supply terminal electrode 31h at least partially overlaps at least a part of the second power supply terminal electrode 41h in a plan view. The first power supply terminal electrode 31i at least partially overlaps at least a part of the second power supply terminal electrode 41i in a plan view.

More specifically, as shown in FIGS. 8 and 9, the portion where the first signal terminal electrode 31f is exposed in the first signal opening Saf (i.e., the first signal terminal 35f) overlaps the portion where the second signal terminal electrode 41f is exposed in the second signal opening Vaf (i.e., the second signal terminal 45f) in a plan view. The portion where the first power supply terminal electrode 31h is exposed in the first power supply opening Sah (i.e., the first power supply terminal 35h) overlaps the portion where the second power supply terminal electrode 41h is exposed in the second power supply opening Vah (i.e., the second power supply terminal 45h) in a plan view. The portion where the first power supply terminal electrode 31i is exposed in the first power supply opening Sai (i.e., the first power supply terminal 35i) overlaps the portion where the second power supply terminal electrode 41i is exposed in the second power supply opening Vai (i.e., the second power supply terminal 45i) in a plan view.

The first signal opening Saf, the first power supply openings Sah and Sai, the second signal opening Vaf, and the second power supply openings Vah and Vai are filled with the conductive paste 60 as shown in FIG. 9. In other words, as shown in FIG. 9, the first signal terminal 35f, the first power supply terminals 35h and 35i, the second signal terminal 45f, and the second power supply terminals 45h and 45i have the surfaces thereof covered by the conductive paste 60. This particular structure holds the first signal terminal 35f and the second signal terminal 45f in contact with each other and electrically connects the first signal terminal 35f and the second signal terminal 45f to each other through the conductive paste 60. The structure also holds the first power supply terminal 35h and the second power supply terminal 45h in contact with each other and electrically connects the first power supply terminal 35h and the second power supply terminal 45h through the conductive paste 60. The structure also holds the first power supply terminal 35i and the second power supply terminal 45i in contact with each other and electrically connects the first power supply terminal 35i and the second power supply terminal 45i through the conductive paste 60.

In the OLED display device 50a, as shown in FIGS. 7 and 8, the second power supply terminal electrode 41h is inclined from the direction in which the branching, first power supply terminal electrode 31h extends (direction X).

The second power supply terminal electrode 41i is inclined from the direction in which the branching, first power supply terminal electrode 31i extends (direction X). In contrast, the first signal terminal electrode 31f and the second signal terminal electrode 41f are parallel to each other as shown in FIGS. 6 and 8. In other words, the second signal terminal electrode 41f is parallel to the direction in which the first signal terminal electrode 31f extends (direction X).

More specifically, referring to FIG. 7, a pair of second power supply terminal electrodes 41h is inclined in different directions from direction X in the respective end portions Eh of the second terminal portion Tb in terms of direction Y. A pair of second power supply terminal electrodes 41i is inclined in different directions from direction X in the respective end portions Ei of the second terminal portion Tb in terms of direction Y. Still referring to FIG. 7, a pair of second power supply terminal electrodes 41h and 41i is symmetric in the left-right direction with respect to the middle portion C of the second terminal portion Tb (more specifically, in direction X in which the second signal terminal electrode 41f extends in the middle portion C of the second terminal portion Tb, in other words, with respect to the second signal terminal electrode 41f).

In other words, as shown in FIGS. 7 and 8, the second power supply opening Vah (second power supply terminal 45h) where the second power supply terminal electrode 41h is exposed resides along the periphery of the second power supply terminal electrode 41h and is shaped like a parallelogram in a plan view. The second power supply opening Vai (second power supply terminal 45i) where the second power supply terminal electrode 41i is exposed resides along the periphery of the second power supply terminal electrode 41i and is shaped like a parallelogram in a plan view. Meanwhile, the second signal opening Vaf (second signal terminal 45f) resides along the periphery of the second signal terminal electrode 41f and is shaped like a rectangle in a plan view as shown in FIGS. 7 and 8.

In this particular structure, the pressure bonding area does not change much between the first power supply terminal 35h and the second power supply terminal 45h and also between the first power supply terminal 35i and the second power supply terminal 45i even when precision varies in direction Y (direction perpendicular to the direction in which the second power supply terminals 45h and 45i extend) in connecting the flexible printed board 40 to the first terminal portion Ta by pressure bonding. The structure therefore reduces differences in pressure bonding area in the OLED display device 50a without having to provide, for example, a guide member to prevent displacements that may occur under pressurization. Hence, a simple structure is capable of connecting the first power supply terminals 35h and the second power supply terminals 45h with high precision and of connecting the first power supply terminals 35i and the second power supply terminals 45i with high precision. The language, "connecting power supply terminal electrodes with each other with high precision," for the purpose of this specification indicates that the power supply terminal electrodes are connected to each other with possibly minimum (small) differences in pressure bonding area between the power supply terminal electrodes caused by pressure bonding discrepancy.

The range of the angle of inclination θ of the second power supply openings Vah and Vai (second power supply terminals 45h and 45i) with respect to direction Y is calculated from, for example, Eqs. 1 to 3 below. Referring to FIG. 11, letting Ws represent the width (length in direction Y) of the first power supply openings Sah and Sai (first power supply terminals 35h and 35i), H represent the length thereof in direction X, P represent the pitch thereof, and Wv represent the width of the second power supply openings Vah and Vai, and assuming that the length and pitch of the second power supply openings Vah and Vai are equal to length H and pitch P of the first power supply openings Sah and Sai, the range of the angle of inclination θ may be determined, for example, so as to satisfy Eq. 1 below.

[Math 1]

$$\pi/2 > \theta > \tan^{-1}(M/(1-K)) \quad \text{Eq. 1}$$

where K=Ws/P(0<K<1), and M=H/P(M>0).

To increase the pressure bonding area between the first power supply terminals 35h and 35i and the second power supply terminals 45h and 45i, it is increasingly preferable if the angle of inclination θ is closer to π/2 so long as Eq. 1 is satisfied.

Meanwhile, referring to FIG. 12, when width Ws of the first power supply openings Sah and Sai is increased to increase the pressure bonding area between the first power supply terminals 35h and 35i and the second power supply terminals 45h and 45i, the range of the angle of inclination θ may be determined, for example, so as to satisfy Eq. 2 below.

[Math 2]

$$\pi/2 > \theta > \tan^{-1}(M) \quad \text{Eq. 2}$$

where M is defined as described above.

Referring to FIG. 13, when length H1 of the first power supply openings Sah and Sai in direction X lies within length H2 of the second power supply openings Vah and Vai in direction X in a plan view (the first power supply openings Sah and Sal and the second power supply openings Vah and Vai have the same width W and pitch P), the range of the angle of inclination θ may be determined, for example, so as to satisfy Eq. 3 below.

[Math 3]

$$\pi/2 > \theta > \tan^{-1}((H1-dx)/(2(P-Ws)-dy)) \quad \text{Eq. 3}$$

where dx=(H1−H2)/2, and dy=H2/(2·tan θ).

The OLED display device 50a described above is arranged, in each subpixel, to turn on the first TFT 9a by inputting a gate signal to the first TFT 9a via the gate line 14 and to apply a data signal to the gate electrode 14b and the capacitor 9c of the second TFT 9b via the source line 18f, to specify the magnitude of the current from the power supply line 18g on the basis of the gate voltage of the second TFT 9b, so that the specified current is fed to the organic light-emitting layer 23, thereby causing the tight-emitting layer 3 in the organic light-emitting layer 23 to emit light to produce an image display. In the OLED display device 50a, the gate voltage of the second TFT 9b is retained by the capacitor 9c when the first TFT 9a is turned off. The light-emitting layer 3 therefore continuously emits light until another gate signal is inputted in the next frame.

Next will be described a method of manufacturing the OLED display device 50a in accordance with the present embodiment. The method of manufacturing the OLED display device 50a in accordance with the present embodiment includes a TFT layer forming step, an OLED forming step, a sealing layer forming step, a first terminal portion forming step, a second terminal portion forming step, and a flexible printed board attaching step.

TFT Layer Forming Step

The TFT layer 20 is formed, for example, by forming the base coat film 11, the first TFTs 9a, the second TFTs 9b, the capacitors 9c, and the planarization film 19 on the surface of the resin substrate layer 10 on a glass substrate by a well-known method.

OLED Forming Step

The first electrodes 21, the edge cover 22, the organic light-emitting layer 23 (the hole injection layer 1, the hole transport layer 2, the light-emitting layer 3, the electron transport layer 4, and the electron injection layer 5), and the second electrodes 24 are formed by a well-known method on the planarization film 19 in the TFT layer 20 formed in the TFT layer forming step, to form the OLEDs 25.

Sealing Layer Forming Step

First, an inorganic insulation film such as a silicon nitride film, a silicon oxide film, or a silicon oxynitride film is formed by plasma CVD using a mask on the surface of the substrate now carrying the OLEDs 25 formed thereon in the OLED forming step, to form the first inorganic insulation film 26.

Subsequently, a film of an organic resin material such as an acrylic resin is formed, for example, by inkjet technology, on the surface of the substrate now carrying the first inorganic insulation film 26 formed thereon, to form the organic film 27.

Furthermore, an inorganic insulation film such as a silicon nitride film, a silicon oxide film, or a silicon oxynitride film is formed by plasma CVD using a mask, on the substrate now carrying the organic film 27 formed thereon, to form the second inorganic insulation film 28, which provides the sealing layer 30.

Finally, after a protection sheet (not shown) is attached to the surface of the substrate now carrying the sealing layer 30 formed thereon, a laser beam is projected onto the glass substrate on the resin substrate layer 10 to detach the glass substrate from the bottom face of the resin substrate layer 10. A protection sheet (not shown) is then attached to the bottom face of the resin substrate layer 10 from which the glass substrate has been detached.

First Terminal Portion Forming Step

For instance, the first signal terminal electrodes 31f and the first power supply terminal electrodes 31h and 31i are formed in the prescribed planar shape on the second interlayer insulation film 17 in an end region of the frame area F by a well-known method. Subsequently, the planarization film 32 is formed and patterned on the first signal terminal electrodes 31f and the first power supply terminal electrodes 31h and 31i so as to form the first signal openings Saf and the first power supply openings Sah and Sai, which provides the first terminal portion Ta.

The first signal terminal electrodes 31f and the first power supply terminal electrodes 31h and 31i may be formed together with, for example, the source lines 18f and the power supply lines 18g at the same time as, for example, the source electrodes 18a and the drain electrodes 18b in the first TFTs 9a are formed in the TFT layer forming step.

Second Terminal Portion Forming Step

For instance, the second signal terminal electrodes 41f and the second power supply terminal electrodes 41h and 41i are formed in the prescribed planar shape on the flexible printed board 40 by a well-known method. Subsequently, the insulation film 42 is formed and patterned on the second signal terminal electrodes 41f and the second power supply terminal electrodes 41h and 41i so as to form the second signal openings Vaf and the second power supply openings Vah and Vai, which provides the second terminal portion Tb.

Flexible Printed Board Attaching Step

For instance, the conductive paste 60 is injected to the first terminal portion Ta formed in the first terminal portion forming step, so as to cover the first signal openings Saf and the first power supply openings Sah and Sai. The second terminal portion Tb of the flexible printed board 40 is attached to the first terminal portion Ta through the conductive paste 60 in such a manner that the first signal openings Saf covered by the conductive paste 60 can overlap the second signal openings Vaf in the second terminal portion Tb formed in the second terminal portion forming step.

The OLED display device 50a in accordance with the present embodiment can be manufactured through these steps.

In the OLED display device 50a, the second power supply terminal electrodes 41h and 41i are inclined from the first power supply terminal electrodes 31h and 31i (direction X). Alternatively, the first power supply terminal electrodes 31h and 31i may be inclined from the direction in which the second power supply terminal electrodes 41h and 41i extend.

In the OLED display device 50a, a pair of second power supply terminal electrodes 41h and 41i (second power supply openings Vah and Vai) is inclined in different directions from direction X in the respective end portions Eh and Ei of the second terminal portion Tb in terms of direction Y and are symmetric in the left-right direction with respect to the middle portion C of the second terminal portion Tb (in direction X). Alternatively, a pair of second power supply terminal electrodes 41h and 41i may be inclined in the same direction from direction X and asymmetric in the left-right direction with respect to the middle portion C as shown in FIG. 10.

In the OLED display device 50a, one of the branching, first power supply terminal electrodes 31h may overlap two or more of the second power supply terminal electrodes 41h in a plan view, and one of the branching, first power supply terminal electrodes 31i may overlap two or more of the second power supply terminal electrodes 41i in a plan view.

In the OLED display device 50a, as shown in FIG. 12, one of the second power supply terminal electrodes 41h may overlap two or more of the branching, first power supply terminal electrodes 31h in a plan view, and one of the second power supply terminal electrodes 41i may overlap two or more of the branching, first power supply terminal electrodes 31i in a plan view.

The OLED display device 50a in accordance with the present embodiment can achieve the following advantages as described above.

(1) The second power supply terminal electrodes 41h in the second terminal portion Tb of the flexible printed board 40 are inclined from the direction in which the first power supply terminal electrodes 31h extend in the first terminal portion Ta (direction X), and the second power supply terminal electrodes 41i are inclined from the direction in which the first power supply terminal electrodes 31i extend (direction X). This particular structure reduces differences in pressure bonding area between the first power supply terminal electrodes 31h (first power supply terminals 35h) and the second power supply terminal electrodes 41h (second power supply terminals 45h) caused by pressure bonding discrepancy and also reduces differences in pressure bonding area between the first power supply terminal electrodes 31i (first power supply terminals 35i) and the second power supply terminal electrodes 41i (second power supply terminals 45i) caused by pressure bonding discrepancy, without having to provide, for example, a guide member. Hence, a simple structure is capable of connecting the first power supply terminal electrodes 31h and the second power supply terminal electrodes 41h with high precision and of connecting the first power supply terminal electrodes 31i and the second power supply terminal electrodes 41i with high precision. That can in turn restrain display quality deterioration.

(2) When a plurality of flexible printed boards 40 is connected to the first terminal portion Ta by pressure bonding, the power supply terminal electrodes can be connected to each other with high precision because differences in pressure bonding area are reduced that are caused by pressure bonding discrepancy between the power supply terminal electrodes on the FPCs and the first power supply terminal electrodes 31h and 31i in the first terminal portion Ta. That can in turn restrain display quality deterioration.

(3) The first power supply terminal electrodes 31h branch off the low-voltage power supply main lines 18h, and the first power supply terminal electrodes 31i branch off the high-voltage power supply main lines 18i. This particular structure enables the detection of spaces between the branching, first power supply terminal electrodes 31h and 31i (more specifically, the first power supply openings Salt and Sai in which the branching, first power supply terminal electrodes 31h and 31i are exposed (first power supply terminals 35h and 35i)), which facilitates alignment in mounting the flexible printed board 40.

Second Embodiment

Figure 14:
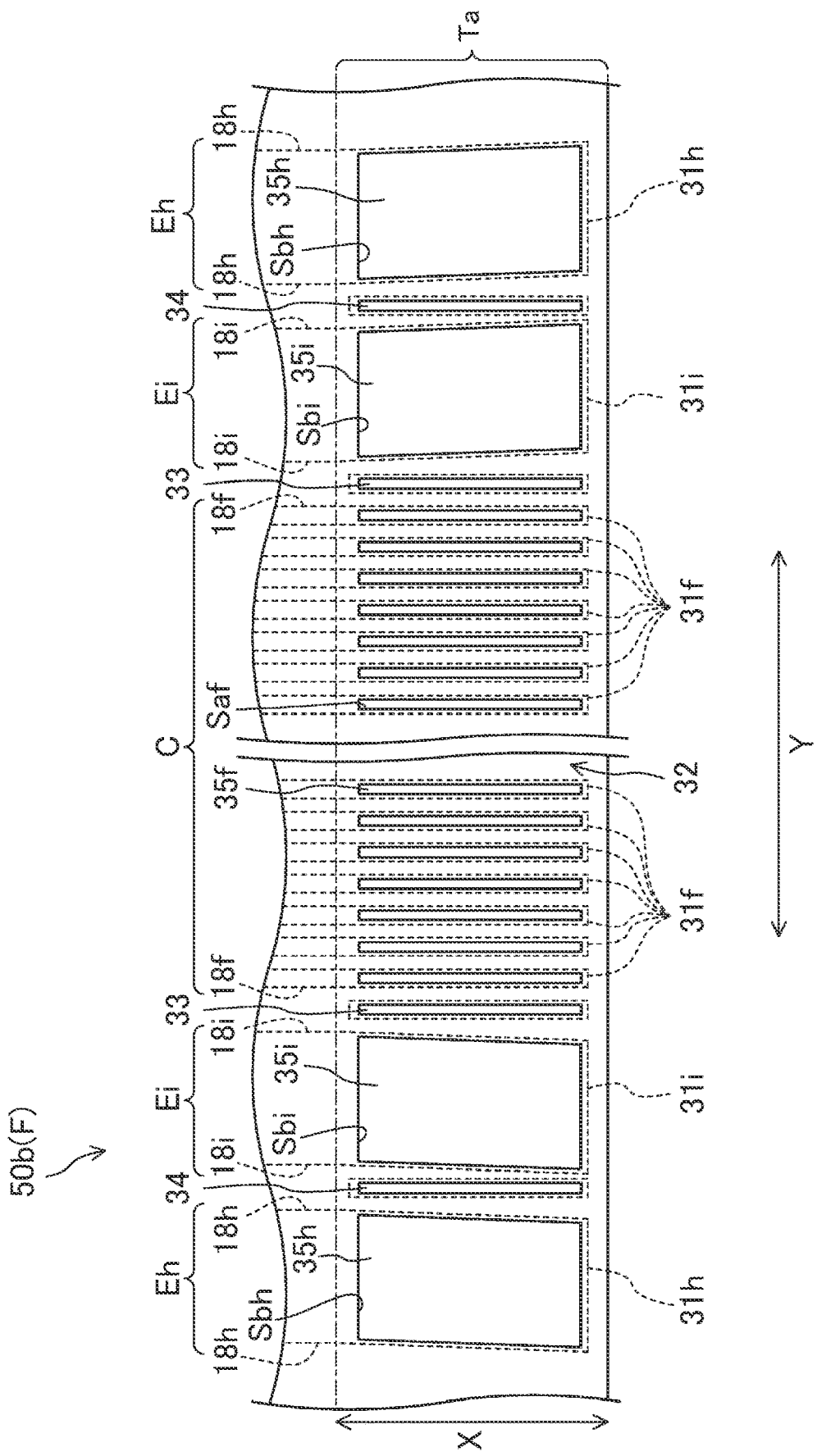
FIG. 14 is an enlarged plan view, equivalent to FIG. 6, of a first terminal portion of a frame area of an OLED display device in accordance with a second embodiment of the disclosure.
Figure 15:
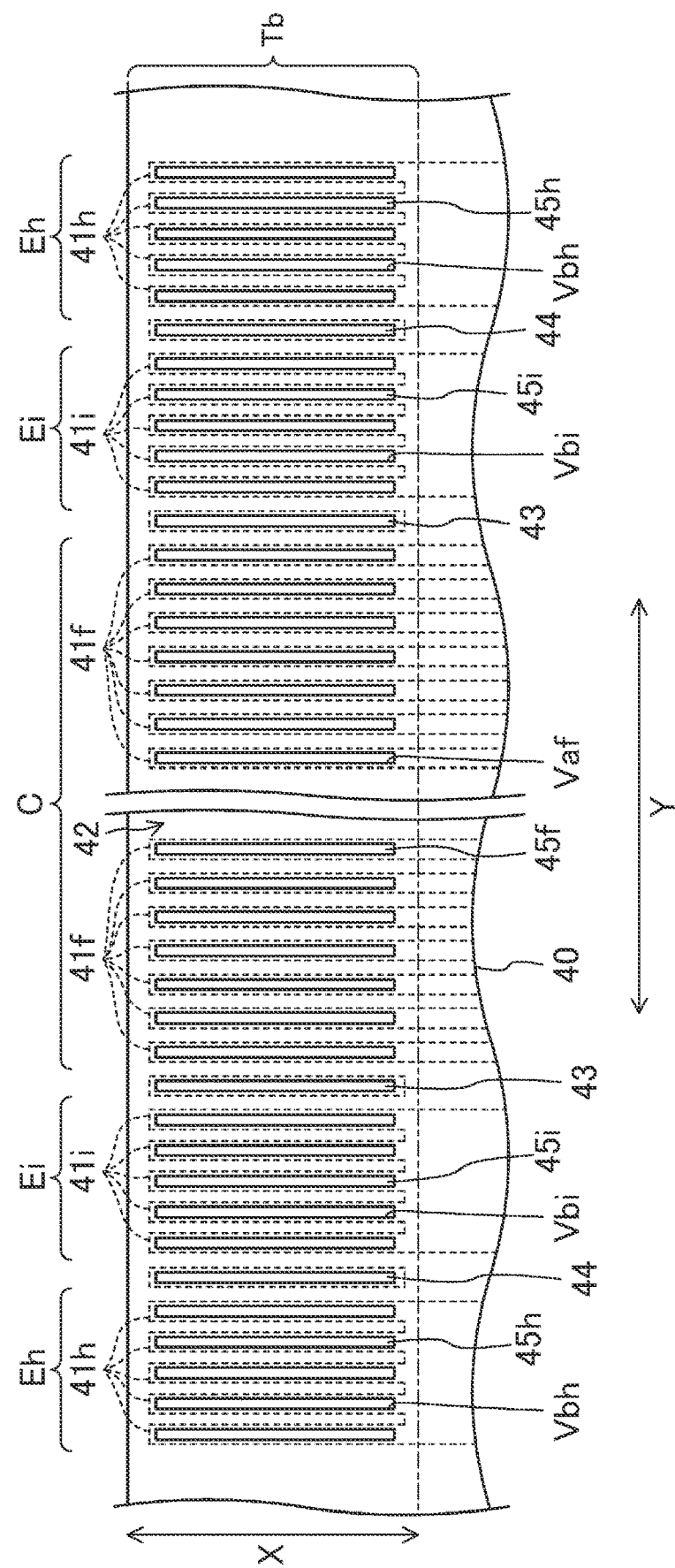
FIG. 15 is an enlarged plan view, equivalent to FIG. 7, of a second terminal portion of a flexible printed board in the OLED display device in accordance with the second embodiment of the disclosure.
Figure 16:
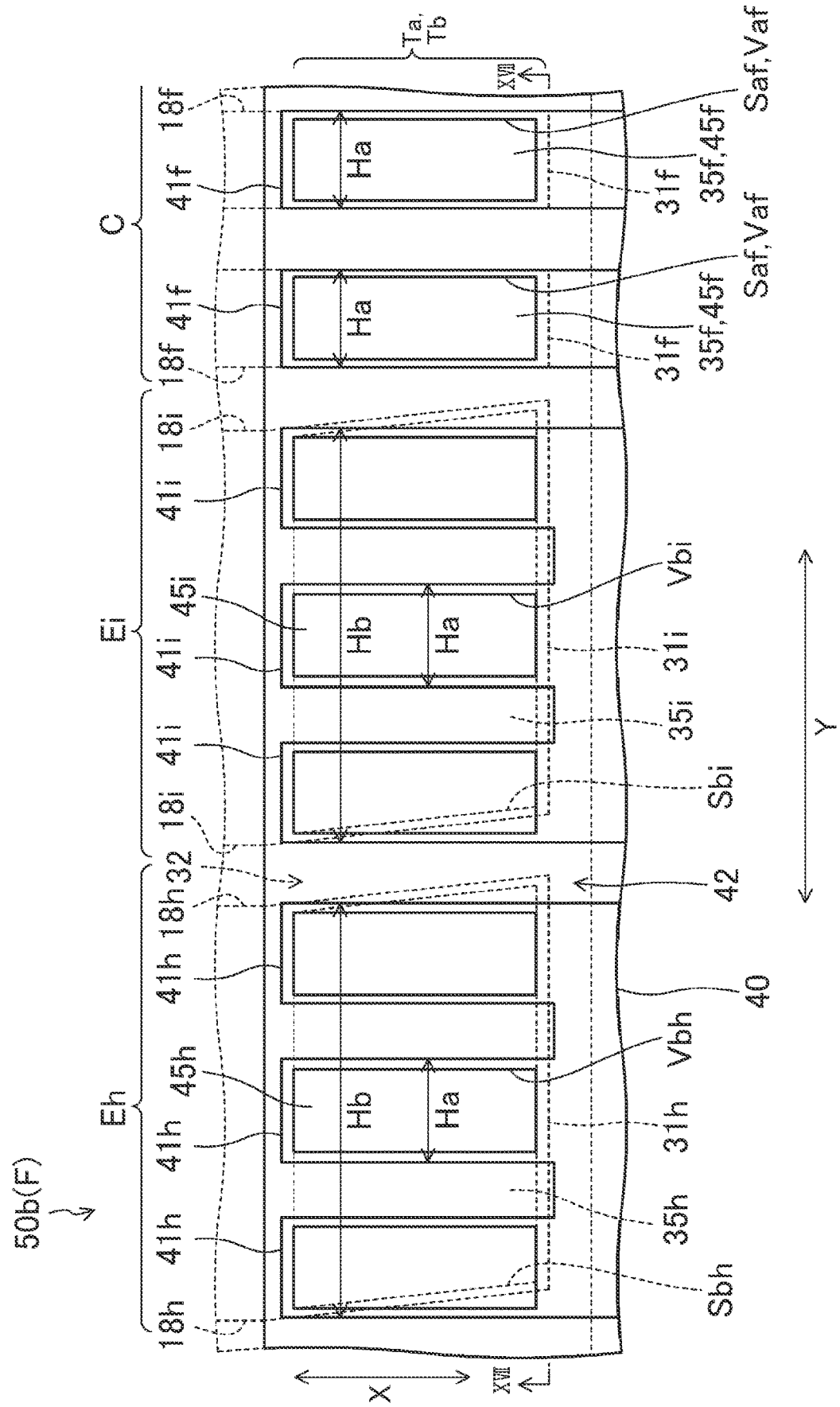
FIG. 16 is a schematic enlarged view, equivalent to FIG. 8, of region A shown in FIG. 1, depicting the first terminal portion and the second terminal portion in the OLED display device in accordance with the second embodiment of the disclosure.
Figure 17:
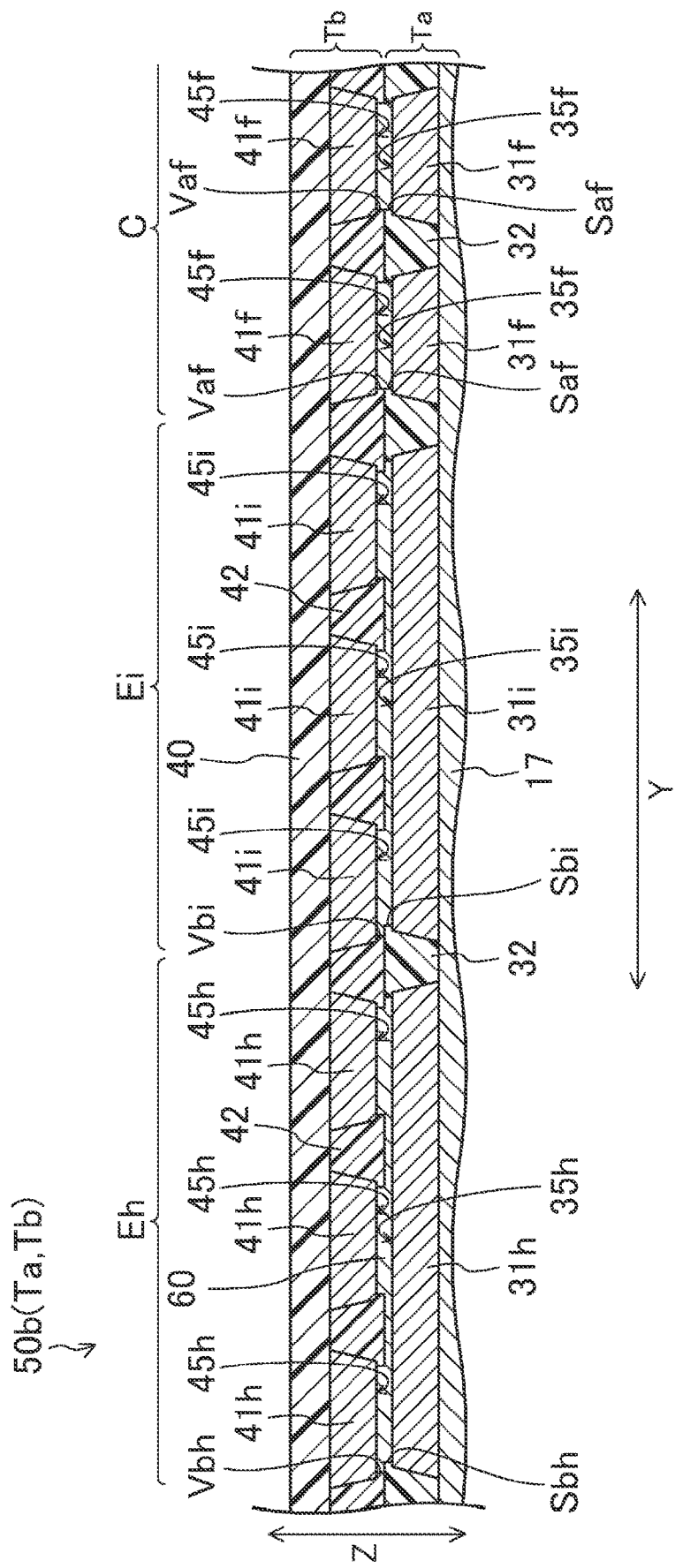
FIG. 17 is a schematic cross-sectional view, taken along line XVII-XVII in FIG. 16 and being equivalent to FIG. 9, of the first terminal portion and the second terminal portion in the OLED display device.

A description is given next of a second embodiment of the disclosure. FIG. 14 is an enlarged plan view, equivalent to FIG. 6, of a first terminal portion Ta of a frame area F of an OLED display device 50b in accordance with the present embodiment. FIG. 15 is an enlarged plan view, equivalent to FIG. 7, of a second terminal portion Tb of a flexible printed board 40 in the OLED display device 50b. FIG. 16 is a schematic enlarged view, equivalent to FIG. 8, of region A shown in FIG. 1, depicting the first terminal portion Ta and the second terminal portion Tb in the OLED display device 50b. FIG. 17 is a schematic cross-sectional view, taken along line XVII-XVII in FIG. 16 and being equivalent to FIG. 9, of the first terminal portion Ta and the second terminal portion Tb in the OLED display device 50b. The OLED display device 50b differs from the first embodiment described above in the first terminal portion Ta and the second terminal portion Tb, but otherwise has the same overall configuration including, for example, the display area D and the frame area F as the first embodiment. The description of the present embodiment will focus on these differences. Members of the present embodiment that are similar to members of the first embodiment are indicated by the same reference numerals and description thereof may be omitted.

As shown in FIG. 14, the OLED display device 50b is characterized in that there is provided a single, first power supply terminal electrode 31h for each low-voltage power supply main line 18h without subdividing the first power supply terminal electrode 31h in a plan view and also that there is provided a single, first power supply terminal electrode 31i for each high-voltage power supply main line 18i without subdividing the first power supply terminal electrode 31i in a plan view.

In other words, the first power supply terminal electrodes 31h and 31i do not branch off the main lines 18h, 18i. More specifically, the first power supply terminal electrodes 31h and 31i have the same line width Hb as the low-voltage power supply main lines 18h and the high-voltage power supply main lines 18i (see FIG. 16). Meanwhile, the second power supply terminal electrodes 41h and 41i have a line width equal to Ha (see FIG. 16). The line width Hb of the first power supply terminal electrodes 31h and 31i is hence larger than the line width Ha of the second power supply terminal electrodes 41h and 41i in the OLED display device 50a. FIGS. 16 and 17 show no dummy terminals 33, 34, 43, and 44. FIG. 16 indicates the first terminal portion Ta of the frame area F with a dotted line and the second terminal portion Tb of the flexible printed board 40 with a solid line.

In the OLED display device 50b, as shown in FIGS. 14, 16, and 17, the first power supply terminal electrodes 31h and 31i are inclined from the direction in which the second power supply terminal electrodes 41h and 41i extend (direction X). There are provided first power supply openings Sbh and Sbi (first power supply terminals 35h and 35i) along the periphery of the first power supply terminal electrodes 31h and 31i. The first power supply terminal electrodes 31h and 31i are inclined in different directions from direction X in the respective end portions Eh and Ei of the first terminal portion Ta in terms of direction Y and are symmetric in the left-right direction with respect to the middle portion C of the first terminal portion Ta (in direction X), as shown in FIG. 14.

More specifically, the first power supply openings Sbh and Sbi (first power supply terminals 35h and 35i) where the first power supply terminal electrodes 31h and 31i are exposed are inclined from direction X. In other words, the first power supply openings Sbh and Sbi (first power supply terminals 35h and 35i) are shaped like a parallelogram in a plan view without being subdivided.

Meanwhile, the second power supply terminal electrodes 41h and 41i are provided parallel to direction X as shown in FIGS. 15 to 17. There is provided a plurality of second power supply openings Vbh and Vbi (second power supply terminals 45h and 45i) along the periphery of the second power supply terminal electrodes 41h and 41i. The plurality of second power supply openings Vbh and Vbi is provided and shaped like a rectangle in a plan view.

The OLED display device 50b can be manufactured by the method of manufacturing the OLED display device 50a in accordance with the first embodiment described above, with changes to the shapes into which the first power supply terminal electrodes 31h and 31i, the second power supply terminal electrodes 41h and 41i, the planarization film 32, and the insulation film 42 are patterned.

In the OLED display device 50b, the first power supply terminal electrodes 31h and 31i are provided without being subdivided in a plan view and inclined from direction X. Alternatively, the second power supply terminal electrodes 41h and 41i may be provided without being subdivided in a plan view and inclined from the direction in which the first power supply terminal electrodes 31h and 31i extend.

In the OLED display device 50b, the first power supply terminal electrodes 31h and 31i are inclined in different directions from direction X in the respective end portions Eh and Ei of the first terminal portion Ta in terms of direction Y and are symmetric in the left-right direction with respect to the middle portion C of the first terminal portion Ta (in direction X). Alternatively, the first power supply terminal electrodes 31h and 31i may be inclined in the same direction from direction X and asymmetric in the left-right direction with respect to the middle portion C.

The OLED display device 50b described here can achieve the following advantages in addition to the advantages described earlier in items (1) and (2).

(4) The first power supply terminal electrodes 31h and 31i (first power supply terminals 35h and 35i) are shaped like a parallelogram in a plan view without being subdivided so that the first power supply terminal electrodes 31h and 31i can be wider than the second power supply terminal electrodes 41h and 41i (second power supply terminals 45h and 45i). This particular structure further reduces differences in pressure bonding area between the first power supply terminals 35h and 35i and the second power supply terminals 45h and 45i caused by pressure bonding discrepancy. Hence, a simple structure is capable of connecting the first power supply terminal electrodes 31h and 31i and the second power supply terminal electrodes 41h and 41i with higher precision. That can in turn restrain display quality deterioration.

Third Embodiment

Figure 18:
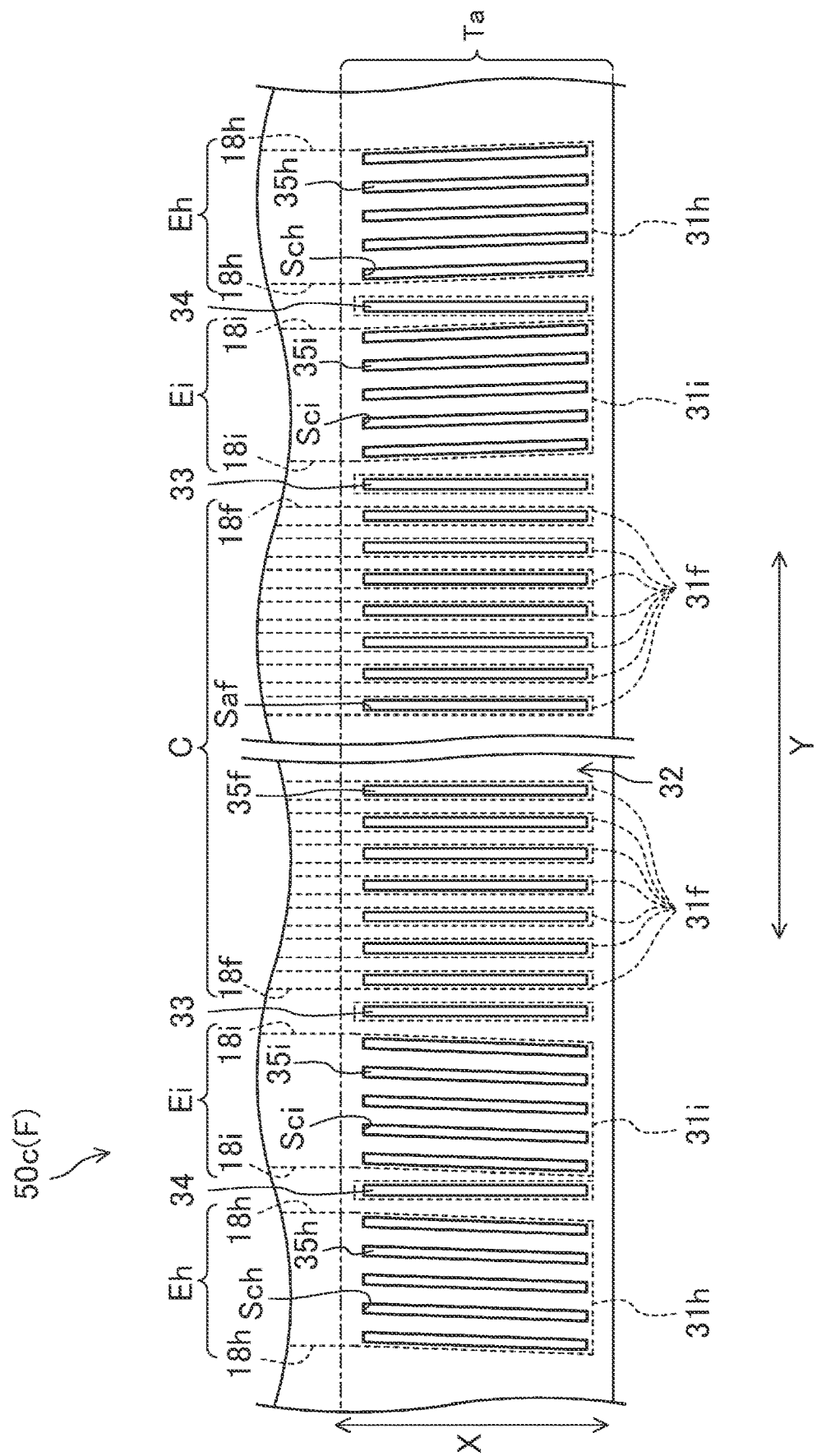
FIG. 18 is an enlarged plan view, equivalent to FIG. 6, of a first terminal portion of a frame area of an OLED display device in accordance with a third embodiment of the disclosure.

A description is given next of a third embodiment of the disclosure. FIG. 18 is an enlarged plan view, equivalent to FIG. 6, of a first terminal portion Ta of a frame area F of an OLED display device 50c in accordance with the present embodiment. The OLED display device 50c differs from the second embodiment described above in the first terminal portion Ta, but otherwise has the same overall configuration including, for example, the display area D and the frame area F as the second embodiment. The description of the present embodiment will focus on these differences. Members of the present embodiment that are similar to members of the second embodiment are indicated by the same reference numerals and description thereof may be omitted.

As shown in FIG. 18, the OLED display device 50c is characterized in that there is provided a plurality of first power supply openings Sch (first power supply terminals 35h) (live first power supply openings Sch in FIG. 18) for a plurality of second power supply terminal electrodes 41h, each first power supply opening Sch being shaped like a parallelogram in a plan view, and also that there is provided a plurality of first power supply openings Sci (first power supply terminals 35i) (five first power supply openings Sci in FIG. 18) for a plurality of second power supply terminal electrodes 41i, each first power supply opening Sci being shaped like a parallelogram in a plan view.

In other words, similarly to the second embodiment above, the first power supply terminal electrodes 31h and 31i are wider than the second power supply terminal electrodes 41h and 41i. However, the plurality of first power supply openings Sch is provided with the same width as the second power supply opening Vbh, and the plurality of first power supply openings Sci is provided with the same width as the second power supply opening Vbi.

The OLED display device 50c can be manufactured by the method of manufacturing the OLED display device 50a in accordance with the first embodiment described above, with changes to the shapes into which the first power supply terminal electrodes 31h and 31i, the second power supply terminal electrodes 41h and 41i, the planarization film 32, and the insulation film 42 are patterned.

In the OLED display device 50c, the plurality of first power supply openings Sch and Sci where the first power supply terminal electrodes 31h and 31i, which are not subdivided in a plan view, are exposed is provided for the plurality of second power supply terminal electrodes 41h and 41i. Alternatively, the second power supply terminal electrodes 41h and 41i may be provided without being subdivided in a plan view, so that there can be provided a plurality of second power supply openings for the plurality of first power supply terminal electrodes 31h and 31i, the second power supply terminal electrodes 41h and 41i being exposed in the second power supply openings.

The OLED display device 50c described here can achieve the following advantages in addition to the advantages described earlier in items (1) and (2).

(5) The plurality of first power supply openings Sch and Sci (first power supply terminals 35h and 35i) is provided for the plurality of second power supply terminal electrodes 41h and 41i. This particular structure enables the detection of spaces between the first power supply openings Sch and Sci, which facilitates alignment in mounting the flexible printed board 40.

Other Embodiments

The embodiments have so far discussed examples where the first signal openings and the second signal openings have the same length in the longer-side direction. Alternatively, the first signal openings and the second signal openings may have different lengths. More specifically, the second signal openings may have a shorter length in the longer-side direction than do the first signal openings in the longer-side direction.

The embodiments have so far discussed examples where the organic light-emitting layer has a five-layer structure including a hole injection layer, a hole transport layer, a light-emitting layer, an electron transport layer, and an electron injection layer. Alternatively, the organic light-emitting layer may have, for example, a three-layer structure including a hole injection and transport layer, a light-emitting layer, and an electron transport and injection layer.

The embodiments have so far discussed examples where the OLED display device includes the first electrodes serving as anodes and the second electrodes serving as cathodes. The disclosure is also applicable to OLED display devices in which the layer structure of the organic light-emitting layer is reversed so that the first electrodes serve as cathodes and the second electrodes serve as anodes.

The embodiments have so far discussed exemplary OLED display devices where the TFT electrode connected to the first electrode serves as a drain electrode. The disclosure is also applicable to OLED display devices where the TFT electrode connected to the first electrode serves as a source electrode.

The embodiments have so far discussed the OLED display device as an exemplary display device. The disclosure is also applicable to any display device including a plurality of current-driven light-emitting elements, for example, applicable to display devices including QLEDs (quantum-dot light-emitting diodes) which are light-emitting elements including a quantum dot layer.

INDUSTRIAL APPLICABILITY

As described above, the disclosure is useful in flexible display devices.

The invention claimed is:
1. A display device comprising:
a substrate;
a TFT layer on the substrate, the TFT layer including a plurality of TFTs;
a plurality of light-emitting elements on the TFT layer, each of the plurality of light-emitting elements including a first electrode, a functional layer, and a second electrode; and
a sealing layer provided so as to cover the plurality of light-emitting elements,
the display device having: a display area where there are provided a plurality of pixels and a plurality of pixel circuits; and a frame area around the display area, wherein
the frame area has an end portion including a first terminal portion including: a plurality of first signal terminal electrodes through which a signal is inputted to the plurality of pixel circuits; and a plurality of first power supply terminal electrodes through which a power supply voltage is inputted to the plurality of pixel circuits,
the display device further comprises a flexible printed board including a second terminal portion facing the first terminal portion,
the second terminal portion includes: a plurality of second signal terminal electrodes electrically connected to the plurality of first signal terminal electrodes via a conductive paste respectively; and a plurality of second power supply terminal electrodes electrically connected to the plurality of first power supply terminal electrodes via a conductive paste respectively,
the plurality of first signal terminal electrodes at least partially overlaps at least a part of the plurality of second signal terminal electrodes in a plan view, and the plurality of first power supply terminal electrodes at least partially overlaps at least a part of the plurality of second power supply terminal electrodes in a plan view, and
the plurality of first signal terminal electrodes and the plurality of second signal terminal electrodes are parallel to each other, and either the plurality of first power supply terminal electrodes or the plurality of second power supply terminal electrodes is inclined from the other.

2. The display device according to claim 1, wherein
the first terminal portion includes a planarization film provided so as to cover the plurality of first signal terminal electrodes and the plurality of first power supply terminal electrodes,
the planarization film has: a plurality of first signal openings where the plurality of first signal terminal electrodes is exposed in at least some respective parts thereof; and a plurality of first power supply openings where the plurality of first power supply terminal electrodes is exposed in at least some respective parts thereof,
the second terminal portion includes an insulation film provided so as to cover the plurality of second signal terminal electrodes and the plurality of second power supply terminal electrodes,
the insulation film has: a plurality of second signal openings where the plurality of second signal terminal electrodes is exposed in at least some respective parts thereof; and a plurality of second power supply openings where the plurality of second power supply terminal electrodes is exposed in at least some respective parts thereof,
the parts of the plurality of first signal terminal electrodes that are exposed in the plurality of first signal openings are in contact with, and electrically connected to, the parts of the plurality of second signal terminal electrodes that are exposed in the plurality of second signal openings, and
the parts of the plurality of first power supply terminal electrodes that are exposed in the plurality of first power supply openings are in contact with, and electrically connected to, the parts of the plurality of second power supply terminal electrodes that are exposed in the plurality of second power supply openings.

3. The display device according to claim 2, wherein
either the plurality of first power supply openings or the plurality of second power supply openings is rectangular in a plan view, and
the other is shaped like a parallelogram in a plan view.

4. The display device according to claim 2, wherein
the first terminal portion has: a middle portion thereof where the plurality of first signal terminal electrodes is provided; and ends thereof where the plurality of first power supply terminal electrodes is provided so as to flank the plurality of first signal terminal electrodes, and
the plurality of second signal terminal electrodes in the second terminal portion is arranged so as to correspond to the plurality of first signal terminal electrodes respectively, and the plurality of second power supply terminal electrodes in the second terminal portion is arranged so as to correspond to the plurality of first power supply terminal electrodes respectively.

5. The display device according to claim 4, wherein the plurality of first power supply terminal electrodes branches off a voltage power supply main line.

6. The display device according to claim 5, wherein the plurality of branching, first power supply terminal electrodes overlaps the plurality of second power supply terminal electrodes in a plan view.

7. The display device according to claim 5, wherein either the plurality of first power supply terminal electrodes or the plurality of second power supply terminal electrodes is symmetric with respect to the middle portion of the first terminal portion or a middle portion of the second terminal portion in the corresponding ends of the first terminal portion or corresponding ends of the second terminal portion.

8. The display device according to claim 5, wherein either the plurality of first power supply terminal electrodes or the plurality of second power supply terminal electrodes is asymmetric with respect to the middle portion of the first terminal portion or a middle portion of the second terminal portion in the corresponding ends of the first terminal portion or corresponding ends of the second terminal portion.

9. The display device according to claim 1, the display device further comprising a first dummy terminal between that one of the plurality of first signal terminal electrodes and that one of the plurality of first power supply terminal electrodes which are adjacent to each other.

10. The display device according to claim 9, wherein the first dummy terminal is separated from the adjacent one of the plurality of first signal terminal electrodes by as large a pitch as the first dummy terminal is separated from the adjacent one of the plurality of first power supply terminal electrodes.

11. The display device according to claim 1, wherein
some of the plurality of first power supply terminal electrodes are electrically connected to the first electrodes, and some of the plurality of first power supply terminal electrodes are electrically connected to the second electrodes,
those of the plurality of first power supply terminal electrodes which are electrically connected to the second electrodes are disposed closer to the ends of the first terminal portion than are those of the plurality of first power supply terminal electrodes which are electrically connected to the first electrodes, and
some of the plurality of second power supply terminal electrodes are arranged so as to correspond to those of the plurality of first power supply terminal electrodes which are electrically connected to the first electrodes respectively, and some of the plurality of second power supply terminal electrodes are arranged so as to correspond to those of the plurality of first power supply terminal electrodes which are electrically connected to the second electrodes respectively.

12. The display device according to claim 11, the display device further comprising a second dummy terminal between that one of those of the plurality of first power supply terminal electrodes which are electrically connected to the first electrodes and that one of those of the plurality of first power supply terminal electrodes which are electrically connected to the second electrodes which are adjacent to each other.

13. The display device according to claim 12, wherein those of the plurality of first power supply terminal electrodes which are electrically connected to the first electrodes and those of the plurality of first power supply terminal electrodes which are electrically connected to the second electrodes are parallel to each other.

14. The display device according to claim 13, wherein the second dummy terminal is parallel to those of the plurality of first power supply terminal electrodes which are electrically connected to the first electrodes and those of the plurality of first power supply terminal electrodes which are electrically connected to the second electrodes.

15. The display device according to claim 14, wherein the second dummy terminal is separated from the adjacent one of those of the plurality of first power supply terminal electrodes which are electrically connected to the first electrodes by as large a pitch as the second dummy terminal is separated from the adjacent one of those of the plurality of first power supply terminal electrodes which are electrically connected to the second electrodes.

16. The display device according to claim 2, wherein the plurality of first signal openings has a same length in the longer-side direction as does the plurality of second signal openings in the longer-side direction.

17. The display device according to claim 2, wherein the plurality of first signal openings has a different length in the longer-side direction than does the plurality of second signal openings in the longer-side direction.

18. The display device according to claim 17, wherein the plurality of second signal openings has a shorter length in the longer-side direction than does the plurality of first signal openings in the longer-side direction.

19. A display device comprising:
a substrate;
a TFT layer on the substrate, the TFT layer including a plurality of TFTs;
a plurality of light-emitting elements on the TFT layer, each of the plurality of light-emitting elements including a first electrode, a functional layer, and a second electrode; and
a sealing layer provided so as to cover the plurality of light-emitting elements,
the display device having: a display area where there are provided a plurality of pixels and a plurality of pixel circuits; and a frame area around the display area, wherein
the frame area has an end portion including a first terminal portion including one first power supply terminal electrode for each plurality of power supply voltages through which the plurality of power supply voltages is inputted to the plurality of pixel circuits, the first terminal portion includes a planarization film provided so as to cover the first power supply terminal electrodes, the planarization film has first power supply openings where the first power supply terminal electrodes are at least partially exposed, the display device further comprises a flexible printed board including a second terminal portion facing the first terminal portion, the second terminal portion includes a plurality of second power supply terminal electrodes electrically connected to the first power supply terminal electrodes via a conductive paste, and the first power supply openings are inclined from the plurality of second power supply terminal electrodes.

20. The display device according to claim 19, wherein the display device comprises a plurality of the first power supply openings so as to correspond to the plurality of second power supply terminal electrodes.

21. The display device according to claim 1, wherein the plurality of light-emitting elements is organic light-emitting diodes.

* * * * *